(12) United States Patent
Chen et al.

(10) Patent No.: US 10,230,030 B2
(45) Date of Patent: Mar. 12, 2019

(54) LIGHT EMITTING DEVICE WITH ASYMMETRICAL RADIATION PATTERN AND MANUFACTURING METHOD OF THE SAME

(71) Applicant: MAVEN OPTRONICS CO., LTD., Hsinchu (TW)

(72) Inventors: Chieh Chen, Palo Alto, CA (US); Tsung-Hsi Wang, Hsinchu (TW)

(73) Assignee: MAVEN OPTRONICS CO., LTD., Hsinchu County (TW)

( * ) Notice: Subject to any disclaimer, the term of this patent is extended or adjusted under 35 U.S.C. 154(b) by 3 days.

(21) Appl. No.: 15/416,921

(22) Filed: Jan. 26, 2017

(65) Prior Publication Data

US 2017/0222107 A1    Aug. 3, 2017

(30) Foreign Application Priority Data

Jan. 28, 2016   (TW) .............................. 105102658 A
Feb. 3, 2016    (CN) .......................... 2016 1 0075824

(51) Int. Cl.
*H01L 33/60* (2010.01)
*H01L 33/48* (2010.01)
(Continued)

(52) U.S. Cl.
CPC .............. *H01L 33/60* (2013.01); *H01L 33/46* (2013.01); *H01L 33/486* (2013.01);
(Continued)

(58) Field of Classification Search
CPC ....... H01L 33/60; H01L 33/46; H01L 33/505; H01L 33/56; H01L 33/486
See application file for complete search history.

(56) References Cited

U.S. PATENT DOCUMENTS

2008/0138919 A1\* 6/2008 Mueller .................. C04B 35/44
                                                           438/27
2009/0057699 A1   3/2009 Basin et al.
(Continued)

FOREIGN PATENT DOCUMENTS

CN         102496613 A      6/2012
CN         103441211 A     12/2013
(Continued)

OTHER PUBLICATIONS

Extended Search Report for EP Patent Application No. 17153321.9, dated Jun. 8, 2017 in 8 pages.
(Continued)

*Primary Examiner* — Mohammed R Alam
(74) *Attorney, Agent, or Firm* — Foley & Lardner LLP; Cliff Z. Liu

(57) ABSTRACT

A monochromatic chip-scale packaging (CSP) light emitting diode (LED) device with an asymmetrical radiation pattern, including a flip-chip LED semiconductor die, and a reflective structure, is disclosed. A white-light broad-spectrum CSP LED device with asymmetrical radiation pattern is also disclosed by further including a photoluminescent structure in the CSP LED device. The photoluminescent structure covers at least the upper surface of the LED semiconductor die. The reflective structure adjacent to the LED semiconductor die and the photoluminescent structure reflects at least partial light beam emitted from the edge surface of the LED semiconductor die or the edge surface of the photoluminescent structure, therefore shaping the radiation pattern asymmetrically. A method to fabricate the aforementioned CSP LED device is also disclosed. Without using additional optical lens, the CSP LED device is suitable for the applications requiring asymmetrical illuminations, while keeping the advantage of its compact form factor.

11 Claims, 51 Drawing Sheets

(51) Int. Cl.
*H01L 33/50* (2010.01)
*H01L 33/46* (2010.01)
*H01L 33/56* (2010.01)

(52) U.S. Cl.
CPC ............ *H01L 33/505* (2013.01); *H01L 33/56* (2013.01); *H01L 2933/0033* (2013.01); *H01L 2933/0041* (2013.01); *H01L 2933/0058* (2013.01); *H01L 2933/0091* (2013.01)

(56) References Cited

U.S. PATENT DOCUMENTS

| | | | |
|---|---|---|---|
| 2010/0119839 A1 | 5/2010 | Chen | |
| 2011/0175117 A1* | 7/2011 | Jagt | H01L 33/44 257/88 |
| 2011/0309398 A1* | 12/2011 | Ito | H01L 33/505 257/98 |
| 2013/0113010 A1 | 5/2013 | Brunner et al. | |
| 2014/0054621 A1 | 2/2014 | Seko | |
| 2015/0299566 A1 | 10/2015 | Kinoshita et al. | |

FOREIGN PATENT DOCUMENTS

| | | |
|---|---|---|
| CN | 106560933 A | 4/2017 |
| EP | 2 701 214 A1 | 2/2014 |
| EP | 3 154 095 A1 | 4/2017 |
| JP | 2013-077679 A | 4/2013 |
| JP | 2013-084690 A | 5/2013 |
| KR | 10-2013-0058708 A | 6/2013 |
| TW | 201425537 A | 7/2014 |
| TW | 201521238 A | 6/2015 |
| WO | WO-2014/087938 | 6/2014 |
| WO | WO-2015/025247 A1 | 2/2015 |
| WO | WO-2015/104623 A1 | 7/2015 |

OTHER PUBLICATIONS

Office Action for corresponding Korean Patent Application dated Jan. 16, 2018, 7 pages.
Office Action and Search Report for Taiwan Patent Application No. 105102658, dated Jan. 26, 2017, 4 pages.
Search Report for Taiwan Patent Application No. 105102658, dated Jan. 26, 2017, 1 page.
Office Action for Korean Patent Application No. 10-2017-0012784, dated Jul. 2, 2018, 3 pages.
Office Action for Japanese Patent Application No. 2017-012623, dated Mar. 6, 2018, 4 pages.
Office Action and Search Report for corresponding Chinese Patent Application No. 201610075824.4, dated Jun. 26, 2018, 7 pages.

\* cited by examiner

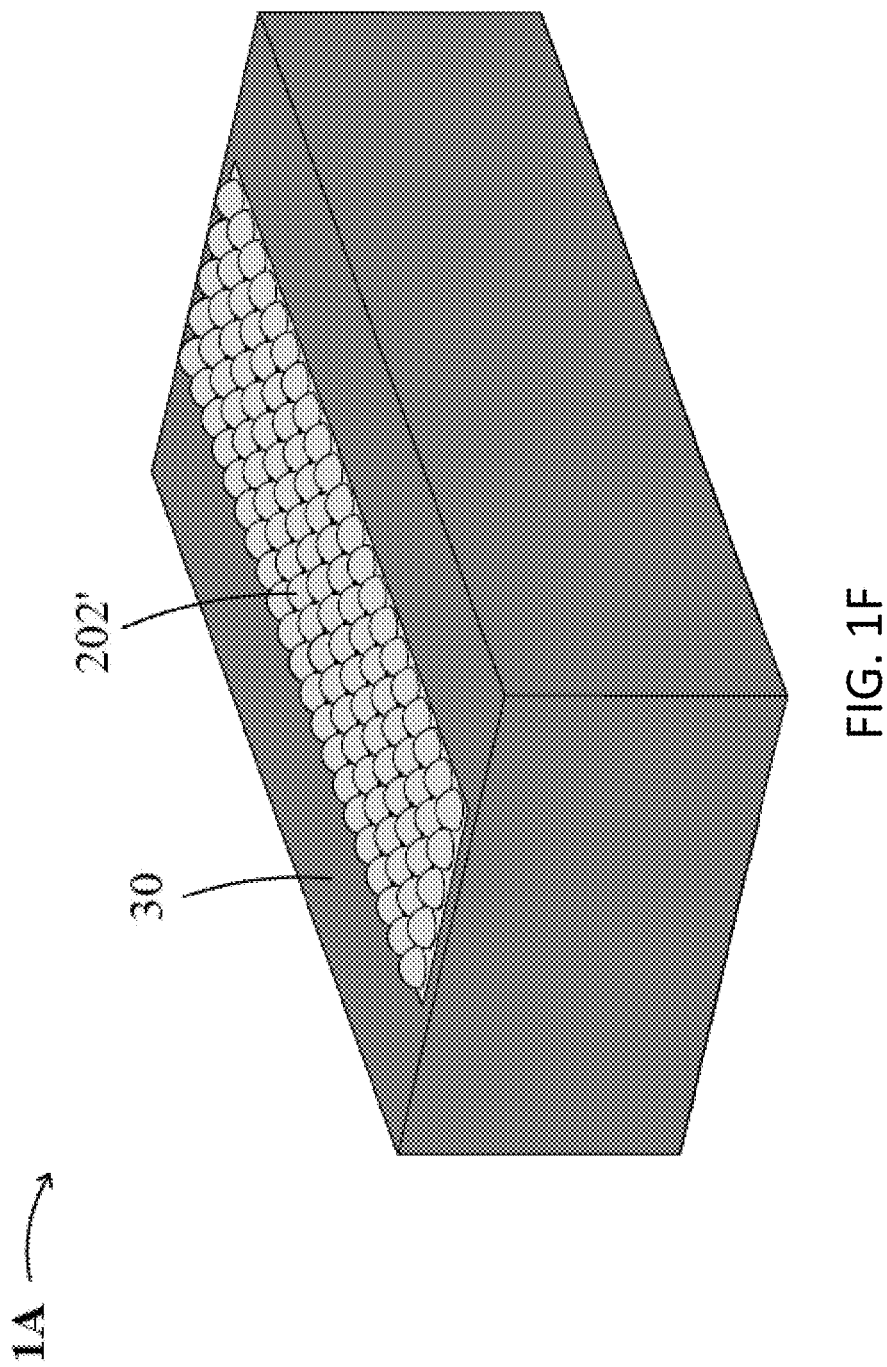

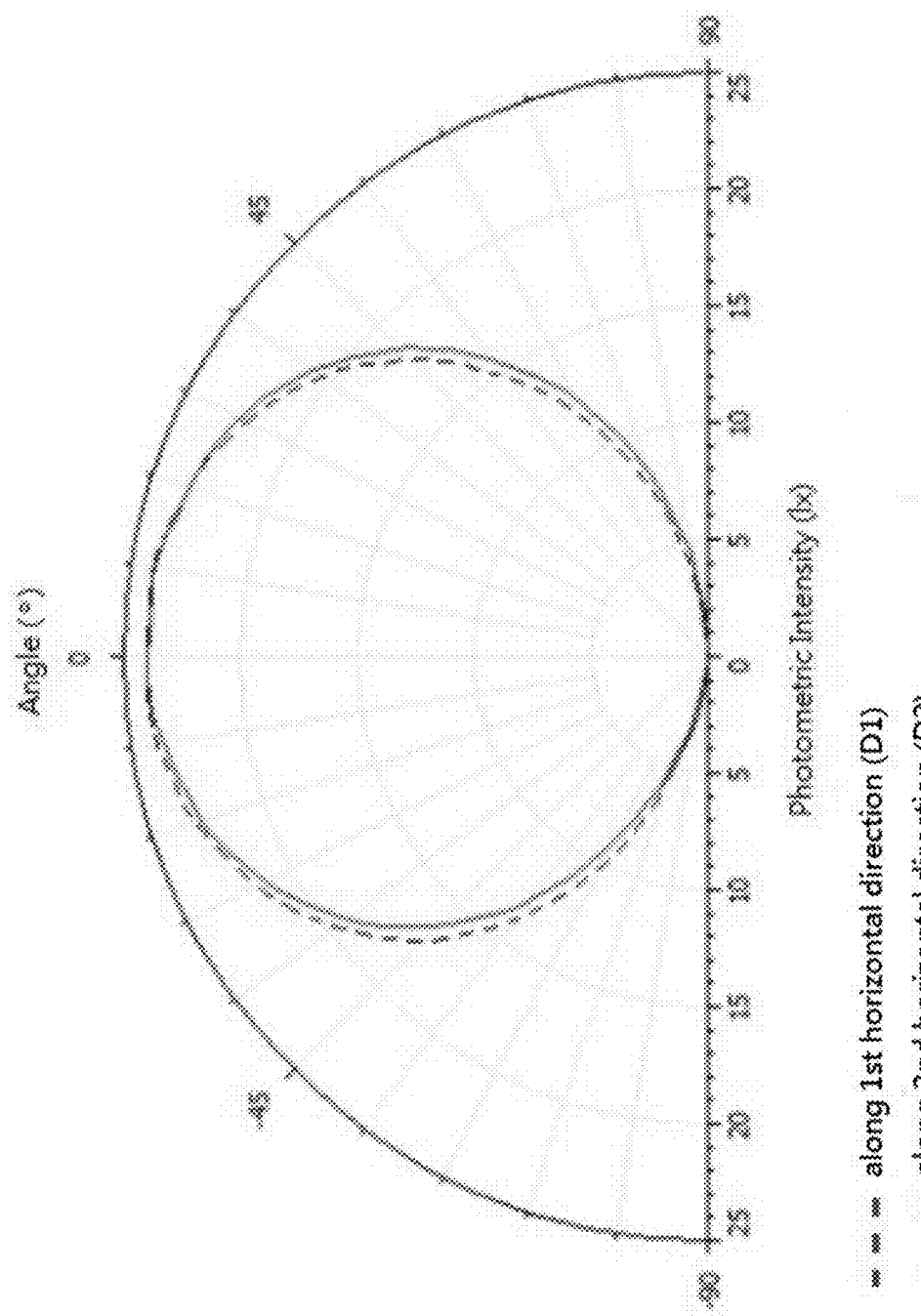

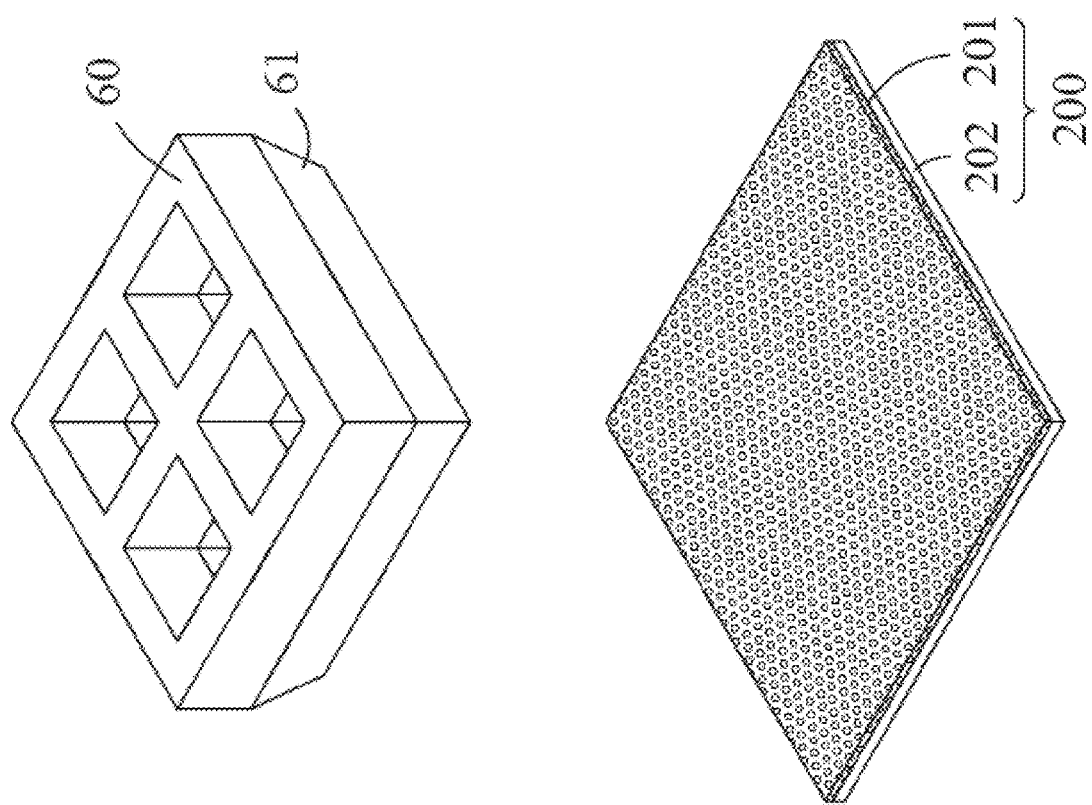

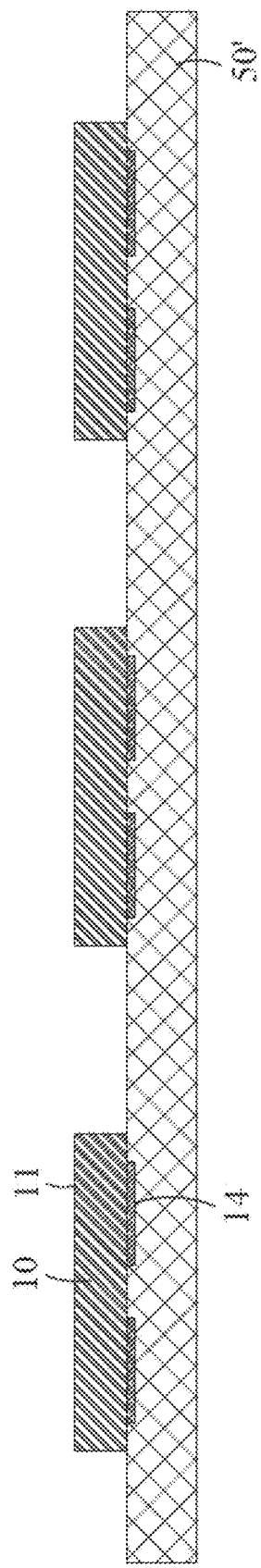

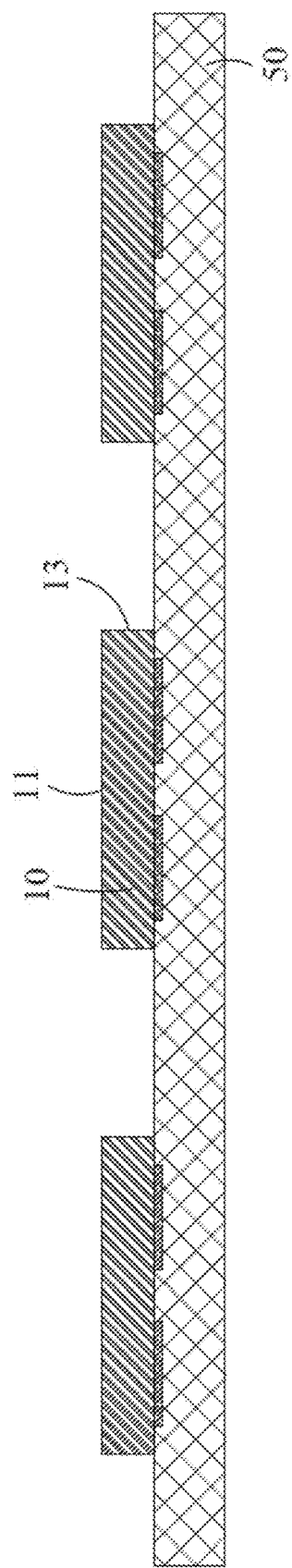

LIGHT EMITTING DEVICE WITH ASYMMETRICAL RADIATION PATTERN AND MANUFACTURING METHOD OF THE SAME

CROSS-REFERENCES TO RELATED APPLICATIONS

This application claims the benefit of and priority to Taiwan Patent Application No. 105102658 filed on Jan. 28, 2016, and Chinese Patent Application No. 201610075824.4 filed on Feb. 3, 2016, which also claims priority to the Taiwan Patent Application, the disclosures of which are incorporated herein by reference in their entirety.

BACKGROUND

Technical Field

The present disclosure relates to a light emitting device and the manufacturing method thereof, in particular to a chip-scale packaging light emitting device including a light emitting diode (LED) semiconductor die which generates electromagnetic radiation while it is in operation.

Description of the Related Art

LEDs are widely used in various applications including traffic lights, backlight units, general lightings, portable devices, automotive lighting and so forth. Generally, an LED semiconductor die is disposed inside a package structure, such as a lead frame, to form a packaged LED device. It may further be disposed and covered by photoluminescent materials, such as phosphors, to form a phosphor-converted white LED device.

Among them, plastic leaded chip carrier (PLCC) type LED devices can be divided into two categories, including top-view LED devices and side-view LED devices, according to their illumination direction. The top-view LED devices are used in general lighting or used as a backlight source in direct backlit LED TVs, while the side-view LED devices are used as a backlight source in edge-lit displays such as LED TVs or mobile phone display panels. Either top-view or side-view LED has a light-emitting surface, for example a rectangular light-emitting surface, wherein an optical axis of the LED device is specified to be a vertical axis perpendicular to the plane of the light-emitting surface and passing through the center of the light-emitting surface. In this disclosure, for the purpose of illustration, a first horizontal direction and a second horizontal direction are specified such that the first horizontal direction is perpendicular to the second horizontal direction and both of the first and the second horizontal directions are perpendicular to the vertical optical axis. The first horizontal direction is further specified to be aligned with the length direction of the LED device; and the second horizontal direction is specified to be aligned with the width direction of the LED device. It is found that if an optical radiation pattern is measured across the first horizontal direction or across the second horizontal direction of a top-view (or side-view) LED device, both radiation patterns are very similar. Since a top-view LED device or a side-view LED device typically has a similar light radiation pattern along the first or along the second horizontal direction, the PLCC-type LED device shows a symmetrical radiation pattern.

The LED devices having symmetrical radiation pattern cannot meet the needs of some applications specifying asymmetrical light sources. For example, street lighting generally specifies a radiation pattern like a "batwing" alongside the street direction. Another example is the LED light source used for a backlight unit as part of the edge-lit LED TV or the display panel for a portable electronic device, where a LED device with a rectangular light-emitting surface is desirable. More desirably, an asymmetrical radiation pattern provides a large viewing angle radiation pattern along the length direction of the LED device, which in turn is aligned with the direction of the light-guide plate for the backlight unit, so that the large viewing angle radiation pattern provides a more uniform light distribution. Therefore the edge-lit light source can reduce dark spots inside the light-guide plate, or alternatively reducing the quantity of the LED devices included. Further, this edge-lit light source is also specified to provide a small viewing angle light radiation pattern along the width direction of the LED device, which in turn is aligned with the thickness direction of the light guide, so that the incident light irradiated from the LED device can penetrate into the thin light-guide plate with a higher transmission efficiency, thus reducing light loss.

Generally, either a top-view PLCC-type LED device or a side-view PLCC-type LED device is fabricated comprising three components: a lead frame having a reflective-cup housing structure formed using a molding process, an LED semiconductor die, and a photoluminescent structure including photoluminescent materials such as phosphors. If an asymmetrical radiation pattern is specified for certain lighting applications, a typical solution is to use a PLCC-type LED device with a symmetrical radiation pattern together with a secondary optical lens to reshape the radiation pattern to achieve the desired asymmetrical light radiation pattern. This will inevitably lead to a significant increase in manufacturing cost. Extra space will be involved to accommodate the secondary optical lens as well, which is unfavorable to end product design for compact consumer electronics. If there is space constraint that the optical lens cannot be incorporated to reshape the light radiation pattern irradiated from PLCC-type LED devices, another solution is to fabricate an asymmetrical reflective cup of the lead frame. For example, two sides of the reflective cup structure is optically reflective so that the radiation pattern along this direction has a smaller viewing angle; and two sides of the cup is optically transparent so that the radiation pattern along this direction has a larger viewing angle. However, this kind asymmetrical reflective cup having two transparent sides is very difficult to fabricate in production. In other words, there remains a need for a streamlined and low-cost method to achieve an asymmetrical light radiation pattern using a PLCC-type LED device.

As the consumer electronics such as LED TVs or portable electronics devices continue to move toward thinner or more compact in size, the PLCC-type LED device as the backlight source also has to reduce its size accordingly. In this trend, the development of chip-scale packaging (CSP) LED device attracts more and more attention of the LED industry due to its small form factor. For example, the CSP LED device has been introduced to replace the widely used top-view PLCC-type LED device used in a direct back-lit LED TV, to further reduce the size of its light source. In this way, a higher light intensity is achievable, thus reducing quantity of the LED devices used. Also, a smaller form factor of the CSP LED device facilitates the design of an even smaller secondary optical lens, thus a thinner TV.

According to the illumination geometry, CSP LED devices can be categorized into two types: 1) top-surface light-emitting (top emitting) CSP LED devices and 2) five-surface light-emitting (five-surface emitting) CSP LED devices. The top emitting CSP LED device is fabricated by incorporating a reflective material disposed to cover the four peripheral edge surfaces of the LED semiconductor die, so light beam is irradiated primarily or solely from the upper surface. Therefore a top emitting CSP LED device has a similar radiation pattern as a PLCC type LED device having a smaller viewing angle (about 120°). On the other hand, light beam can be irradiated outwardly through its upper surface and four peripheral edge surfaces of the five-surface CSP LED devices. Therefore a five-surface emitting CSP LED device has a larger viewing angle (about 140°~160°). However, similar to a PLCC-type LED device, both the top emitting CSP LED device and the five-surface emitting CSP LED device have a symmetrical light radiation pattern, thus unfavorable to applications specifying an asymmetrical light radiation pattern.

Another approach uses a CSP LED device together with a secondary optical lens to produce an asymmetrical radiation pattern. However, this approach not only significantly increases the production cost, but also involves extra space to accommodate the optical lens, thus defeating the advantage of using a small form factor CSP LED device. In other words, effective solution is still lacking for using CSP LED devices to achieve asymmetrical radiation pattern. Therefore, providing a low-cost and effective solution is desired for the CSP LED devices to achieve an asymmetrical light radiation pattern while keeping the advantage of its compact form factor.

SUMMARY

One object according to some embodiments of the present disclosure is to provide a CSP LED device and a manufacturing method thereof, to shape the viewing angle of the CSP LED device in at least one specific direction (for example, along the first horizontal direction or along the second horizontal direction of the light emitting surface), so as to provide an asymmetrical radiation pattern while maintaining the CSP device's advantage of a small form factor.

To achieve the aforementioned object, a CSP LED device according to some embodiments of the present disclosure comprises: an LED semiconductor die, a photoluminescent structure, and a reflective structure. The LED semiconductor die is a flip-chip LED semiconductor die having an upper surface, a substantially parallel but oppositely facing lower surface, an edge surface and a set of electrodes, wherein the edge surface is formed and extends between the outer rim of the upper surface and that of the lower surface, and the set of electrodes is disposed on the lower surface of the LED semiconductor die. The photoluminescent structure has an upper surface, a lower surface and an edge surface, wherein the lower surface of the photoluminescent structure covers at least the upper surface of the LED semiconductor die. Furthermore, the photoluminescent structure comprises a photoluminescent layer and a supernatant light-transmitting layer disposed on the photoluminescent layer. One desirable embodiment is that the photoluminescent structure selectively covers the entire upper surface and two side edges of the edge surface of the LED semiconductor die. Specifically, two side edges of the edge surface of the LED semiconductor die perpendicular to the first horizontal direction are covered with the photoluminescent structure; whereas two side edges of the edge surface of the LED semiconductor die perpendicular to the second horizontal direction are not covered. The reflective structure at least partially covers the edge surface of the LED semiconductor die and the edge surface of the photoluminescent structure. One desirable embodiment is that the reflective structure selectively covers two side edges of the edge surface of the LED semiconductor die and two side edges of the edge surface of the photoluminescent structure perpendicular to the second horizontal direction; whereas two side edges of the edge surface of the LED semiconductor die perpendicular to the first horizontal direction are covered by the photoluminescent structure. According to this desirable embodiment, the viewing angle of the CSP LED device along the first horizontal direction is larger compared with the viewing angle along the second horizontal direction, thus forming a CSP LED device with an asymmetrical radiation pattern.

To achieve the aforementioned object, a manufacturing method of the CSP LED device according to some embodiments of the present disclosure comprises: 1) forming a photoluminescent structure including a photoluminescent layer and a supernatant light-transmitting layer on an LED semiconductor die, wherein the photoluminescent layer is sandwiched between the supernatant light-transmitting layer and an upper surface of the LED semiconductor die; 2) forming a reflective structure to cover at least partially an edge surface of the photoluminescent structure and at least partially an edge surface of the LED semiconductor die.

Therefore, some advantageous benefits for the embodiments according to the present disclosure are described as follows. The reflective structure at least partially covers the edge surface of the LED semiconductor die and reflects the light beam emitted from the edge surface of the LED semiconductor die along the first horizontal direction and/or the second horizontal direction, so as to reduce the viewing angle along the first horizontal direction and/or the second horizontal direction to produce an overall asymmetrical radiation pattern.

Therefore, the CSP LED device according to embodiments of the present disclosure can provide an asymmetrical light irradiation pattern without the aid of an additional optical lens, thus maintaining the advantage of a CSP device's small form factor, which in turn facilitates the design of a thinner or a more compact electronic device. For example, when a CSP LED device with an asymmetrical radiation pattern is utilized in a backlight unit of an edge-lit LED TV, a mobile phone, or a tablet computer device, a large viewing angle of the CSP LED device can be arranged along the in-plane direction of the light-guide plate inside the backlight unit. This design can increase the pitch distance between two adjacent CSP LED devices, thus reducing the quantity of used CSP LED devices. Larger viewing angle along the in-plane direction can reduce the dark spots inside the light-guide plate as well. On the other hand, a smaller viewing angle of the CSP LED device can be arranged along the thickness direction of the light-guide plate, thus improving the transmission efficiency of the light beam incident from the CSP LED device to the light-guide plate by reducing the light beam loss. Also, the CSP LED device having a small form factor allows more space reduction along the edges of the backlight unit, thus resulting in a smaller frame design while maintaining the same viewing area.

Other aspects and embodiments of the disclosure are also contemplated. The foregoing summary and the following detailed description are not meant to restrict the disclosure to any particular embodiment but are merely meant to describe some embodiments of the disclosure.

BRIEF DESCRIPTION OF THE DRAWINGS

FIG. 1E, FIG. 1F, and FIG. 1G are schematic drawings in 3D perspective views depicting a CSP LED device according to one embodiment of the present disclosure.

FIG. 5A is an example optical radiation pattern of a comparative CSP LED device.

FIG. 6A, FIG. 6B, FIG. 6C, FIG. 6D, FIG. 6E, FIG. 7A, FIG. 7B, FIG. 8A, FIG. 8B, and FIG. 8C are schematic drawings illustrating a manufacturing process to fabricate a CSP LED device according to one embodiment of the present disclosure.

FIG. 13, FIG. 14, FIG. 15A, FIG. 15B, FIG. 16A, FIG. 16B, FIG. 16C, FIG. 17A, FIG. 17B, FIG. 18A and FIG. 18B are schematic drawings illustrating a manufacturing process to fabricate a CSP LED device according to another embodiment of the present disclosure.

DETAILED DESCRIPTION

Definitions

Figure 1A:
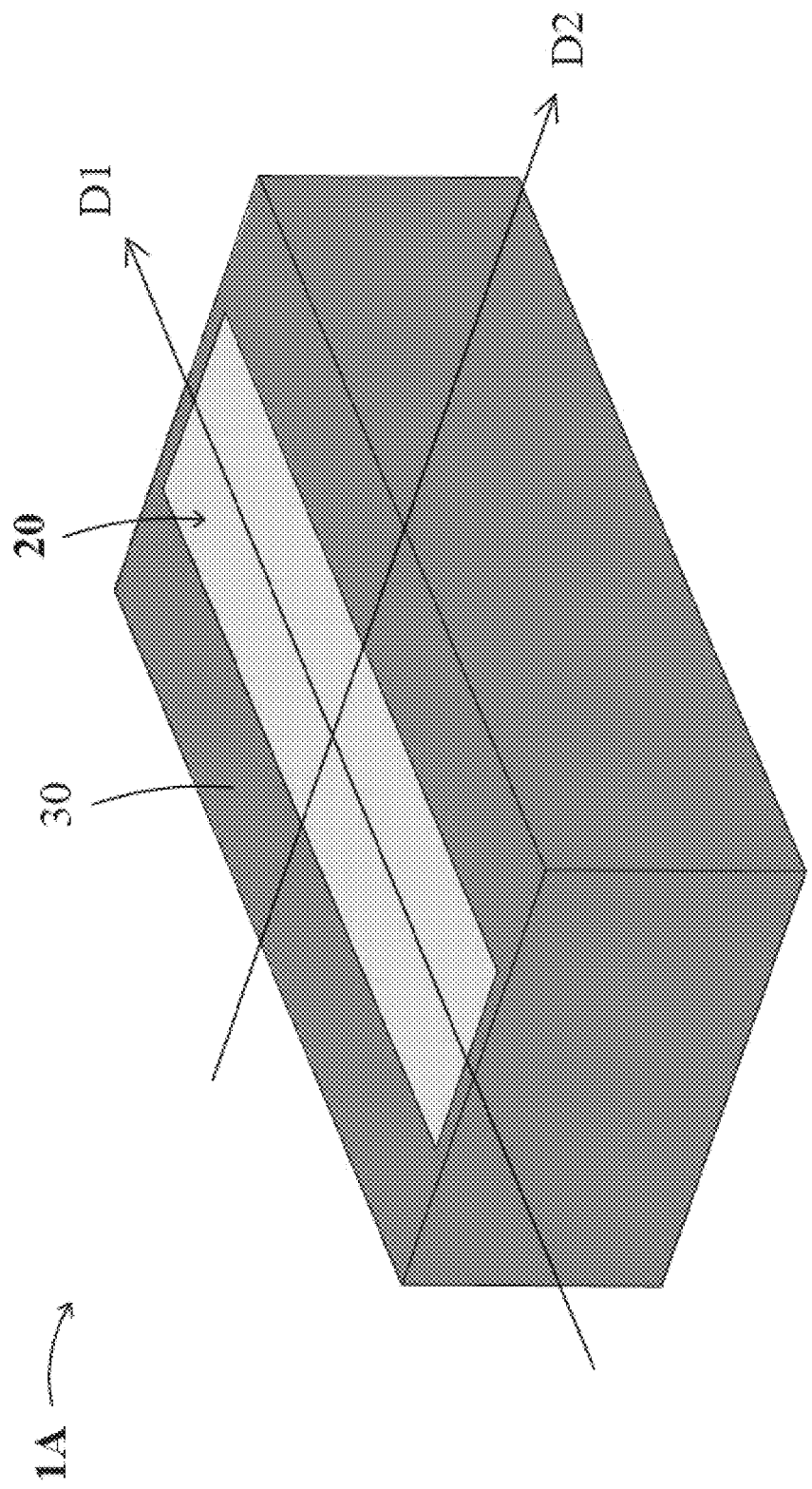
FIG. 1A is a schematic drawing in a three-dimensional (3D) perspective view depicting a CSP LED device according to one embodiment of the present disclosure.

The following definitions apply to some of the technical aspects described with respect to some embodiments of the invention. These definitions may likewise be expanded upon herein.

As used herein, the singular terms "a," "an," and "the" include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. By "substantially optically transparent," the term can refer to a light transmittance of at least 80% for a range of wavelengths in a spectrum of interest, such as at least 85%, at least 90%, or at least 95%. By "perpendicular" or "substantially perpendicular," the terms can refer to a relative orientation of precisely 90°, as well as a range of variation of less than or equal to ±5° relative to 90°, such as less than or equal to ±4°, less than or equal to ±3°, less than or equal to ±2°, less than or equal to ±1°, less than or equal to ±0.5°, less than or equal to ±0.1°, or less than or equal to ±0.05°.

As used herein with respect to photoluminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the object can refer to an average of various orthogonal dimensions of the object. Thus, for example, a size of an object that is a spheroidal can refer to an average of a major axis and a minor axis of the object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 1B:
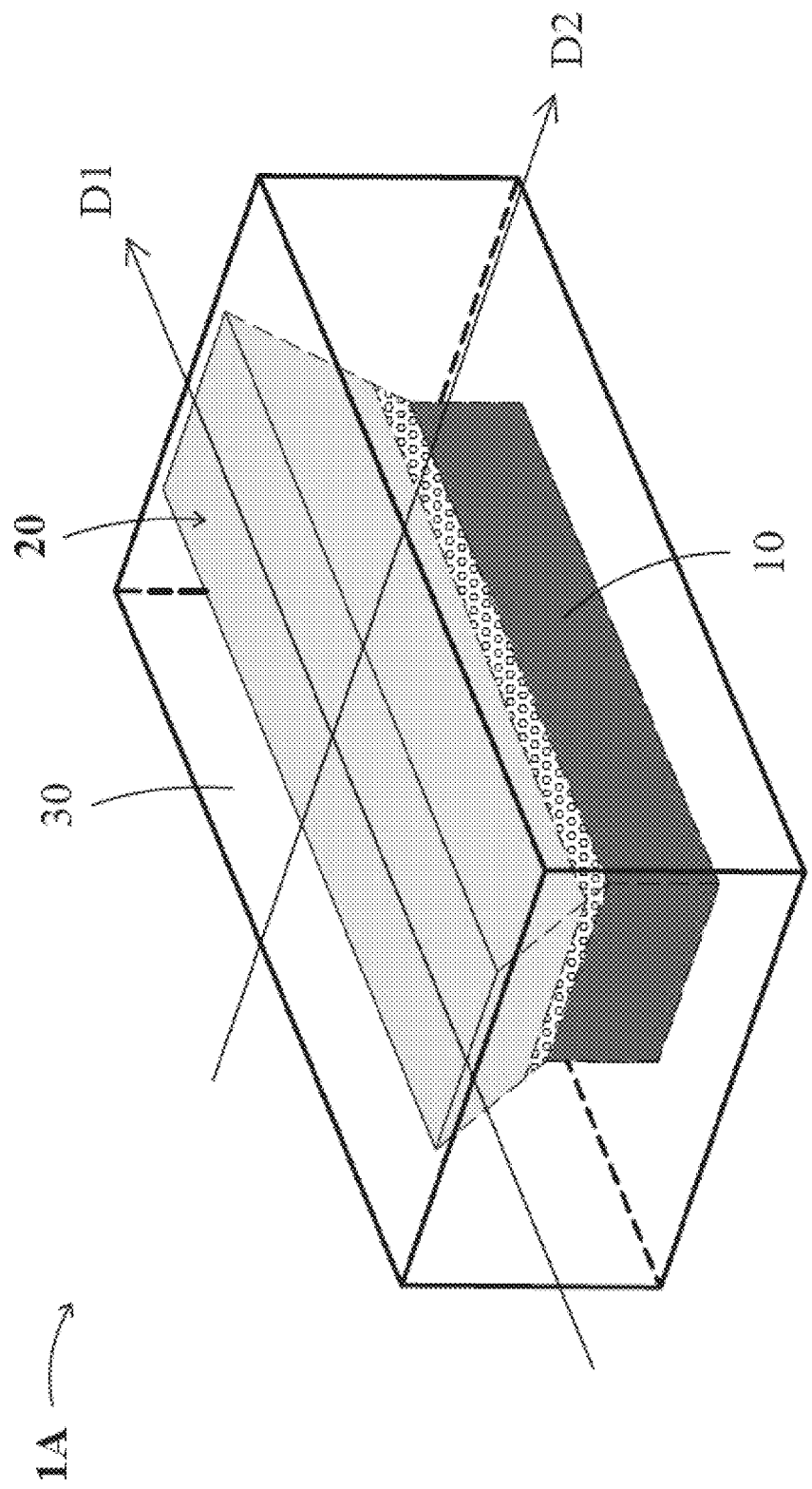
FIG. 1B is a schematic drawing in a 3D perspective view depicting a CSP LED device according to one embodiment of the present disclosure.
Figure 1C:
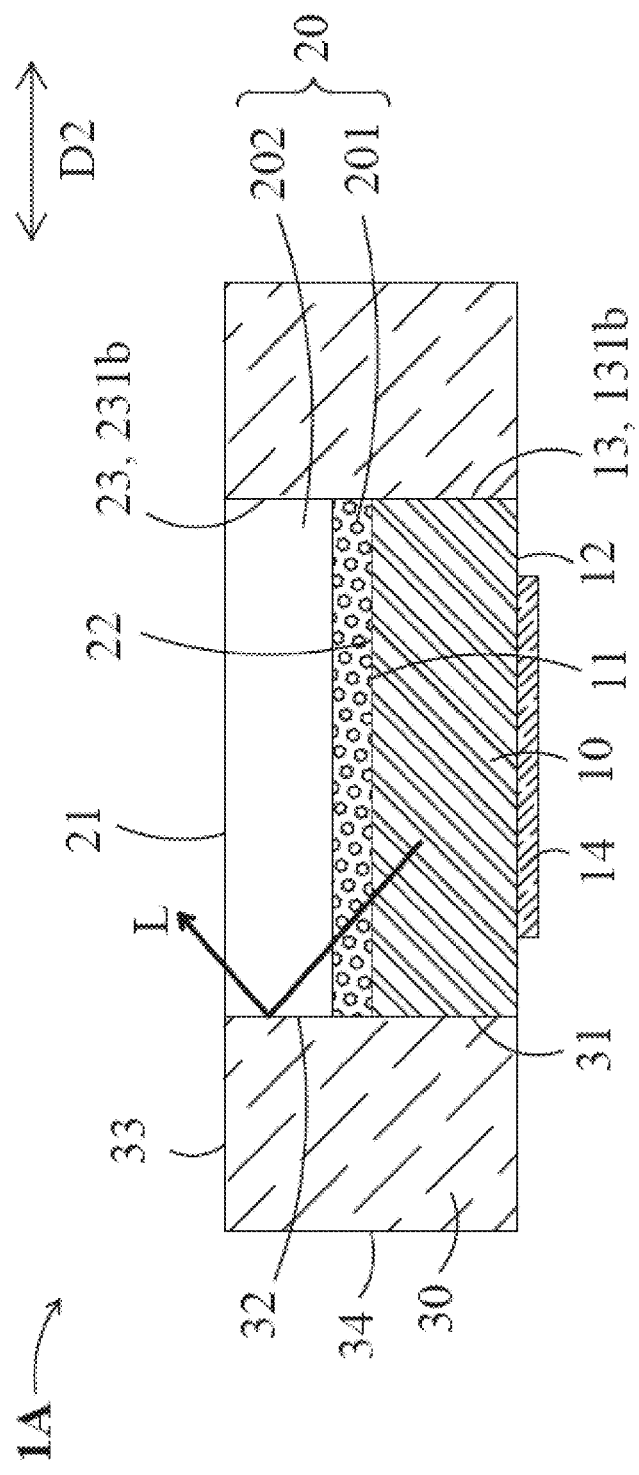
FIG. 1C is a schematic drawing in a cross-sectional view depicting a CSP LED device according to one embodiment of the present disclosure.
Figure 1D:
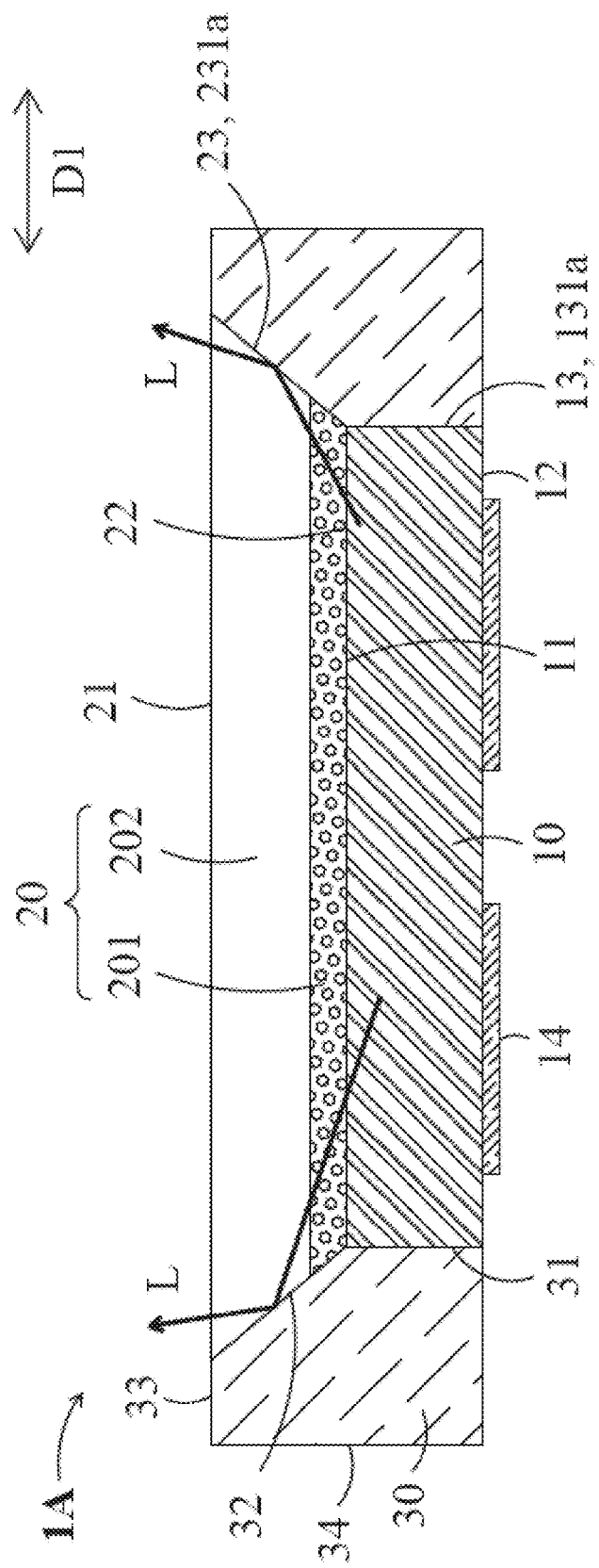
FIG. 1D is a schematic drawing in a cross-sectional view depicting a CSP LED device according to one embodiment of the present disclosure.

FIG. 1A and FIG. 1B are schematic drawings in 3D perspective views, and FIG. 1C and FIG. 1D are schematic drawings in cross-sectional views of a CSP LED device according to one embodiment of the present disclosure. For the purpose of illustration, a first horizontal direction D1 and a second horizontal direction D2 are specified in the present disclosure as follows. The first horizontal direction D1 is specified to be aligned with the length direction of the CSP LED device 1A; and the second horizontal direction D2, perpendicular to the first horizontal direction D1, is specified to be aligned with the width direction of the CSP LED device 1A. Both of the first horizontal direction D1 and the second horizontal direction D2 are perpendicular to the optical axis of the CSP LED device 1A, which is specified to be a vertical axis passing through the geometric center of the light emitting surface of the CSP LED device 1A (not illustrated). The CSP LED device 1A includes an LED semiconductor die 10, a photoluminescent structure 20, and a reflective structure 30. The detailed technical contents are described as follows.

As illustrated in FIG. 1C, the LED semiconductor die 10 is desirably a flip-chip type LED semiconductor die having an upper surface 11, a lower surface 12, an edge surface 13, and a set of electrodes 14. The upper surface 11 and the lower surface 12 are formed substantially in parallel, facing oppositely to each other. The upper surface 11 and the lower surface 12 can be a rectangular shape so that the first horizontal direction D1 is aligned with the two edge lines along the length direction of the upper surface 11 (or lower surface 12), and the second horizontal direction D2 is aligned with the other two edge lines along with the width direction.

The edge surface 13 is formed and extends between the upper surface 11 and the lower surface 12, connecting the outer rim of the upper surface 11 with that of the lower surface 12. In other words, the edge surface 13 is formed along the outer rim of the upper surface 11 and that of the lower surface 12. The edge surface 13 comprises two pairs of side edges 131, wherein the first pair of the side edges 131a, as shown in FIG. 1D, is disposed facing oppositely to each other and is perpendicular to the first horizontal direction D1, and the second pair of the side edges 131b, as shown in FIG. 1C, is disposed facing oppositely to each other and is perpendicular to the second horizontal direction D2.

The set of electrodes 14, or a plurality of electrodes, is disposed on the lower surface 12. Electric energy (not illustrated) is applied to the LED semiconductor die 10 through the set of electrodes 14 so that electro-luminescence is generated. As shown in FIG. 1C and FIG. 1D, the light beam L generated by the LED semiconductor die 10 is irradiated mostly from the upper surface 11, and some of the light beam L is irradiated from the edge surface 13. No electrodes are disposed on the upper surface 11 in this flip-chip type semiconductor die 10 of the depicted embodiment.

The photoluminescent structure 20 having an upper surface 21, a lower surface 22, and an edge surface 23 can change the wavelength of the light beam L emitted from the LED semiconductor die 10. The upper surface 21 and the lower surface 22 is rectangular in shape, and are disposed facing oppositely to each other. Two edge lines of the upper surface 21 (or lower surface 22) are aligned with the first horizontal direction D1, and the other two edge lines are aligned with the second horizontal direction D2. In other words, the upper surface 21 is formed substantially in parallel with a plane specified by the first horizontal direction D1 and the second horizontal direction D2. Both the upper surface 21 and the lower surface 22 are disposed substantially in parallel and are aligned with the horizontal plane specified by D1 and D2.

The edge surface 23 is formed and extends between the upper surface 21 and the lower surface 22, connecting the outer rim of the upper surface 21 with that of the lower surface 22. In other words, the edge surface 23 is formed along the outer rim of the upper surface 21 and that of the lower surface 22. The edge surface 23 includes two pairs of side edges 231, wherein the first pair of the side edges 231a as shown in FIG. 1D is disposed facing oppositely to each other, and the second pair of side edges 231b as shown in FIG. 1C is disposed facing oppositely to each other.

In addition, the surface area of the upper surface 21 of the photoluminescent structure 20 is larger than that of the lower surface 22 so that at least one pair of the side edges 231a or 231b of the edge surface 23 is beveled with respect to the upper surface 21 or the lower surface 22. For example, the surface area of the upper surface 21 can be about 1.1× or more of the surface area of the lower surface 22, such as about 1.2× or more, about 1.3× or more, about 1.4× or more, or about 1.5× or more. In the present embodiment, the first pair of side edges 231a is beveled with respect to the first horizontal direction D1, and the second pair of side edges 231b is vertical with respect to the second horizontal direction D2. For example, a slanted angle between the side edges 231a with respect to the first horizontal direction D1 can be less than about 90°, such as about 88° or less, about 85° or less, or about 80° or less.

In this embodiment of CSP LED device 1A, the photoluminescent structure 20 includes a photoluminescent layer 201 and a supernatant light-transmitting layer 202, wherein the supernatant light-transmitting layer 202 is formed and disposed on the photoluminescent layer 201. Therefore, the upper surface of the supernatant light-transmitting layer 202 is the upper surface 21 of the entire photoluminescent structure 20, and the lower surface of the photoluminescent layer 201 is the lower surface 22 of the entire photoluminescent structure 20. Both of the supernatant light-transmitting layer 202 and the photoluminescent layer 201 allow the light beam L to pass through. Thus their composition material may include a substantially transparent light-transmitting material such as a silicone resin. The composition material for the photoluminescent layer 201 may further include photoluminescent materials mixed inside a light-transmitting material. As a result, when the light beam L emitted from the LED semiconductor die 10 passes through the photoluminescent layer 201, partial light beam L is down-converted into a longer wavelength by the photoluminescent materials, and then transmitted to the supernatant light-transmitting layer 202.

The photoluminescent layer 201 may be formed by the method disclosed in U.S. patent publication US2010/0119839, wherein one or more layers of the photoluminescent materials and light-transmitting materials are deposited sequentially to form the photoluminescent layer 201. Therefore, the photoluminescent layer 201 formed by this method can be a multi-layer structure including at least one light-transmitting layer and at least one photoluminescent layer (not illustrated) stacked on top of one another. The technical contents of the U.S. patent publication are hereby incorporated by reference in its entirety.

Although the supernatant light-transmitting layer 202 does not function as wavelength conversion of the incident light beam L, it can serve as an environmental barrier layer protecting the photoluminescent layer 201 from being contaminated or damaged. In addition, the supernatant light-transmitting layer 202 can improve mechanical rigidity of the photoluminescent structure 20 so that the photoluminescent structure 20 is not easily bent, thus providing better handling in mass production.

As for the structure of the CSP LED device 1A, the photoluminescent structure 20 is disposed on the LED semiconductor die 10, so that the lower surface 22 of the photoluminescent structure 20 is adhered to and covering the upper surface 11 of the LED semiconductor die 10. Thus the top surface 21 and the edge surface 23 of the photoluminescent structure 20 will also be disposed above the upper surface 11 of the semiconductor die 10. In other words, the photoluminescent structure 20 covers the upper surface 11 of the LED semiconductor die 10 by the photoluminescent layer 201, and the supernatant light-transmitting layer 202 is spaced apart from the upper surface 11 accordingly.

The reflective structure 30 can reflect the light beam L to restrict the irradiation direction of the light beam L. The reflective structure 30 at least partially covers the edge surface 13 of the LED semiconductor die 10, and at least partially covers the edge surface 23 of the photoluminescent structure 20. For example, at least one pair of the side edges 131a or 131b of the edge surface 13 of the LED semiconductor die 10 is covered by the reflective structure 30, and at least one pair of the side edges 231a or 231b of the photoluminescent structure 20 is covered by the reflective structure 30 as well. In the present embodiment of the CSP LED device 1A, both pairs of side edges 131, including 131a and 131b, and both pairs of the side edges 231, including 231a and 231b, are substantially fully covered by the reflective structure 30, but the upper surface 21 of the photoluminescent structure 20 is not covered by the reflective structure 30. Thus, the light beam L is reflected (or absorbed) by the reflective structure 30 at the edge surface 13 and the edge surface 23, and can selectively escape outwardly from the upper surface 21 of the photoluminescent structure 20.

Desirably, the reflective structure 30 covers and adjoins the edge surface 13 of the LED semiconductor die 10 and the edge surface 23 of the photoluminescent structure 20, so that there is substantially no gap between the reflective structure 30 and the edge surface 13. Similarly, there is substantially no gap between the reflective structure 30 and the edge surface 23. Thus, the reflective structure 30 has an inner edge surface 31 conformal to the edge surface 13 of the LED semiconductor die 10. Also, an inner edge surface 32 of the reflective structure 30 is conformal to the edge surface 23 of the photoluminescent structure 20. Desirably, an upper surface 33 of the reflective structure 30 may be substantially level with the upper surface 21 of the photoluminescent structure 20. The reflective structure 30 also has an outer edge surface 34 and the outer edge surface 34 is vertical.

In one embodiment, the reflective structure 30 may be fabricated using a transparent and malleable resin material, wherein light scattering particles are dispersed. Specifically, a malleable resin material, such as polyphthalamide (PPA), polycyclohexylene-dimethylene terephthalate (PCT), or epoxy molding compound (EMC), is used to form the reflective structure 30. Another example malleable resin material can be a transparent silicone resin with high refractive index (RI) (the RI is desirably between about 1.45 and about 1.55) or a low Refractive Index silicone resin (the RI is desirably between about 1.35 and about 1.45). Example light scattering particles dispersed within the transparent and malleable resin material include, $TiO_2$, BN, $SiO_2$, $Al_2O_3$, or a combination of those particles. Other oxide, nitride, and ceramic particles can be used. It is desired that the particle size of the light scattering particles is about half wavelength of the visual light spectrum, for example ranging from about 150 nm to about 450 nm. It will be appreciated that the reflective structure 30 can also be made of other electronic encapsulation or packaging materials or the like.

The above is the technical descriptions of each component of the CSP LED device 1A, which has at least the following technical features.

As shown in FIG. 1C and FIG. 1D, according to the embodiment of the CSP LED device 1A, the light beam L emitted from the LED semiconductor die 10 will enter the photoluminescent layer 201 first, then passes through the supernatant light-transmitting layer 202, and finally irradiates out from the upper surface 21 of the photoluminescent structure 20. Rather than being emitted out directly right after the light beam L passes through the photoluminescent layer 201, the light beam L passing through the photoluminescent layer 201 of the CSP LED device 1A still travels inside the supernatant light-transmitting layer 202. That is, the supernatant light-transmitting layer 202 together with the reflective structure 30 defines an optical cavity to shape the irradiation pattern in the present embodiment of the CSP LED device 1A. Thus, the viewing angle of the CSP LED device 1A can be restricted.

More specifically, FIG. 1D shows a schematic drawing in a cross-sectional view with a cutting plane along the first horizontal direction D1. Since the pair of the side edges 231a as shown in FIG. 1D is beveled, the light beam L can be irradiated out from the upper surface 21 with a relatively large viewing angle. In contrast, FIG. 1C shows a schematic drawing of the CSP LED device 1A in a cross-sectional view with a cutting plane along the second horizontal direction D2. The side edges 231b are substantially vertical, so that the light beam L can be emitted out from the upper surface 21 with a smaller viewing angle. Therefore, an asymmetrical light radiation pattern of the CSP LED device 1A can be achieved.

It is desirable that the length of the upper surface 21 along the first horizontal direction D1 is larger than the width of the upper surface 21 along the second horizontal direction D2. For example, the length of the upper surface 21 can be about 1.1× or more of the width of the upper surface 21, such as about 1.2× or more, about 1.3× or more, about 1.4× or more, or about 1.5× or more. In this arrangement, the aspect ratio specified by the length divided by the height (or thickness) of the supernatant light-transmitting layer 202 is larger than the aspect ratio specified by the width divided by the height (or thickness) of the supernatant light-transmitting layer 202. It will be appreciated that the larger the aspect ratio, the larger is the viewing angle. Therefore, it is advantageous to combine the effect of a larger aspect ratio and the effect of a beveled reflector along the first horizontal direction to create an asymmetrical radiation pattern for the CSP LED device 1A.

In view of the above, the CSP LED device 1A, which can provide different viewing angles with respect to the first and the second horizontal directions, is suitable to applications specifying asymmetrical illuminations.

Figure 1E:
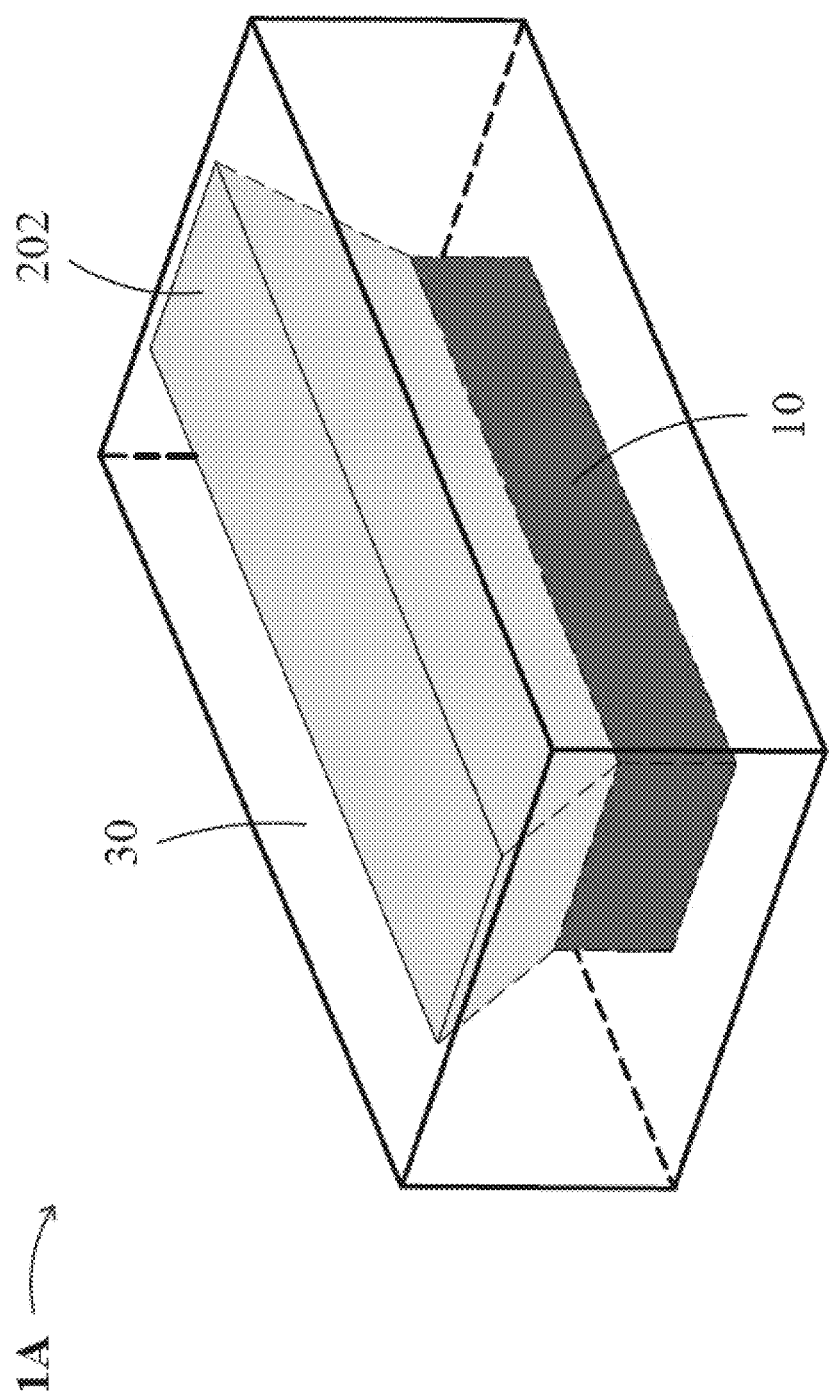

Furthermore, as illustrated in FIG. 1E, the photoluminescent structure 20 of the CSP LED device 1A can be replaced by a substantially transparent light-transmitting layer 202 with similar shape as the photoluminescent structure 20. In this arrangement, the CSP LED device 1A includes the LED semiconductor die 10, the light-transmitting layer 202, and the reflective structure 30, but omits the photoluminescent layer 201, so that the light beam emitted from the LED semiconductor die 10 will not encounter photoluminescent materials while passing through the light-transmitting layer 202. This embodiment can be used to fabricate a monochromatic CSP LED device emitting light beam of monochromatic spectrum (such as red, green, blue, ultraviolet, infrared, and so forth) with an asymmetrical radiation pattern. Similarly, this technique of using a substantially transparent light-transmitting layer without including photoluminescent materials can also be applied to other embodiments described in the present disclosure.

As shown in FIG. 1F, the CSP LED device 1A may further include a micro-lens array layer on the light-emitting surface. It is desirable that the micro-lens array layer is formed simultaneously in the same fabrication process of forming the supernatant light-transmitting layer 202 using a molding method or the like. Thus, both the micro-lens array layer and the supernatant light-transmitting layer 202 can be fabricated in one single fabrication process concurrently. As illustrated in FIG. 1F, a supernatant light-transmitting structure 202' comprises a micro-lens array layer, which may comprise a plurality of orderly or randomly arranged microstructures. Other variants of the microstructures may be a hemisphere, a pyramid, a cone, a pillar and so forth, or may be a roughened surface. Therefore, the supernatant light-transmitting structure 202' comprising the micro-lens array layer allows the light beam to be easily escaped outwardly by reducing the amount of light beam reflected back at the interface of the supernatant light-transmitting structure 202' and the ambient environment due to total internal reflection. Thus the overall light extraction efficiency and the luminous efficacy of CSP LED device 1A are improved. This technique of incorporating a micro-lens array layer on the surface of the supernatant light-transmitting layer can also be applied to other embodiments according to the present disclosure.

Figure 1G:
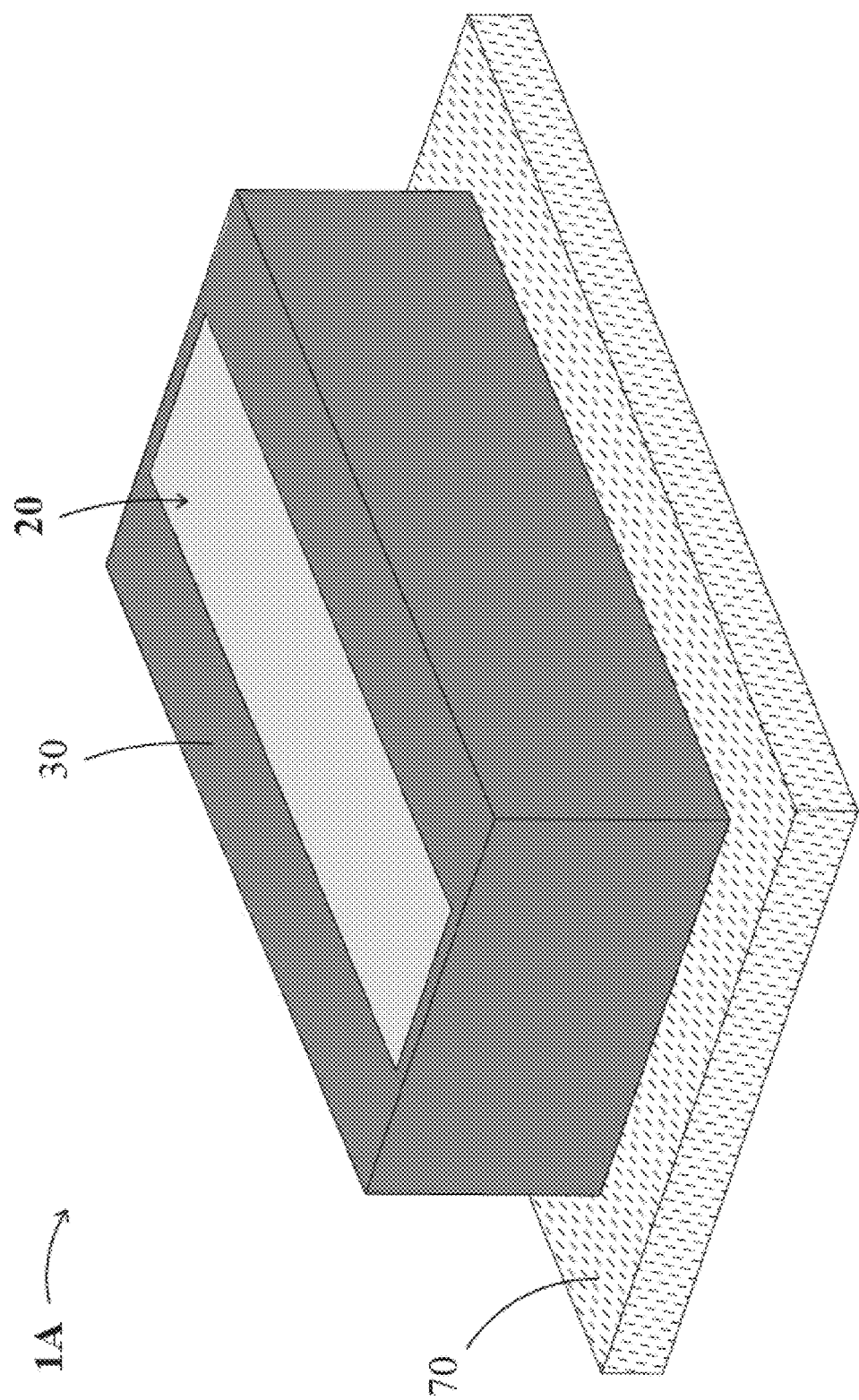

As shown in FIG. 1G, the CSP LED device 1A may further include a submount 70, which may be a ceramic substrate, a glass substrate, a silicon substrate, a printed circuit board (PCB), or a metal-core printed circuit board (MCPCB). The submount 70 has a circuit (not illustrated) capable of conducting electric energy through a pair of bonding pads usually located underneath the submount 70. Thus, the submount 70 functions as fan-out pads to electrically connect to the electrodes of the CSP LED device 1A, which facilitates the application of the CSP LED device 1A and subsequent Surface Mounting bonding process at the module level. This technique of incorporating a submount 70 can also be applied to other embodiments according to the present disclosure.

The aforementioned paragraphs are detailed descriptions of the embodiment related to the CSP LED device 1A. Detailed descriptions of other embodiments of CSP LED devices according to the present disclosure are explained as follows. It will be appreciated that some detailed descriptions of the features and advantages found in the following embodiments of the light emitting devices are similar to those of the CSP LED device 1A and are therefore omitted for the purpose of brevity.

Figure 2A:
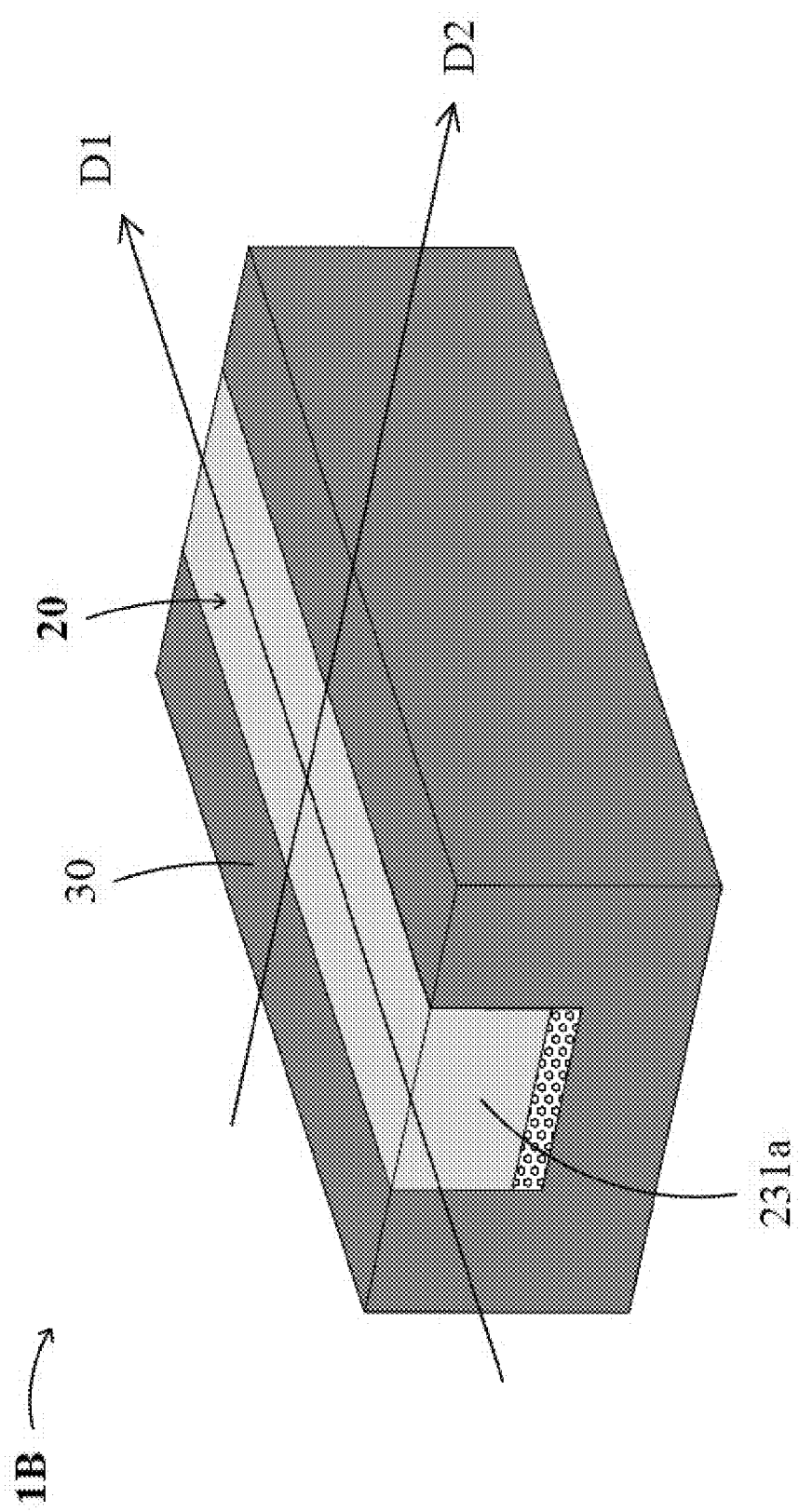
FIG. 2A and FIG. 2B are schematic drawings in 3D perspective views depicting a CSP LED device according to another embodiment of the present disclosure.
Figure 2B:
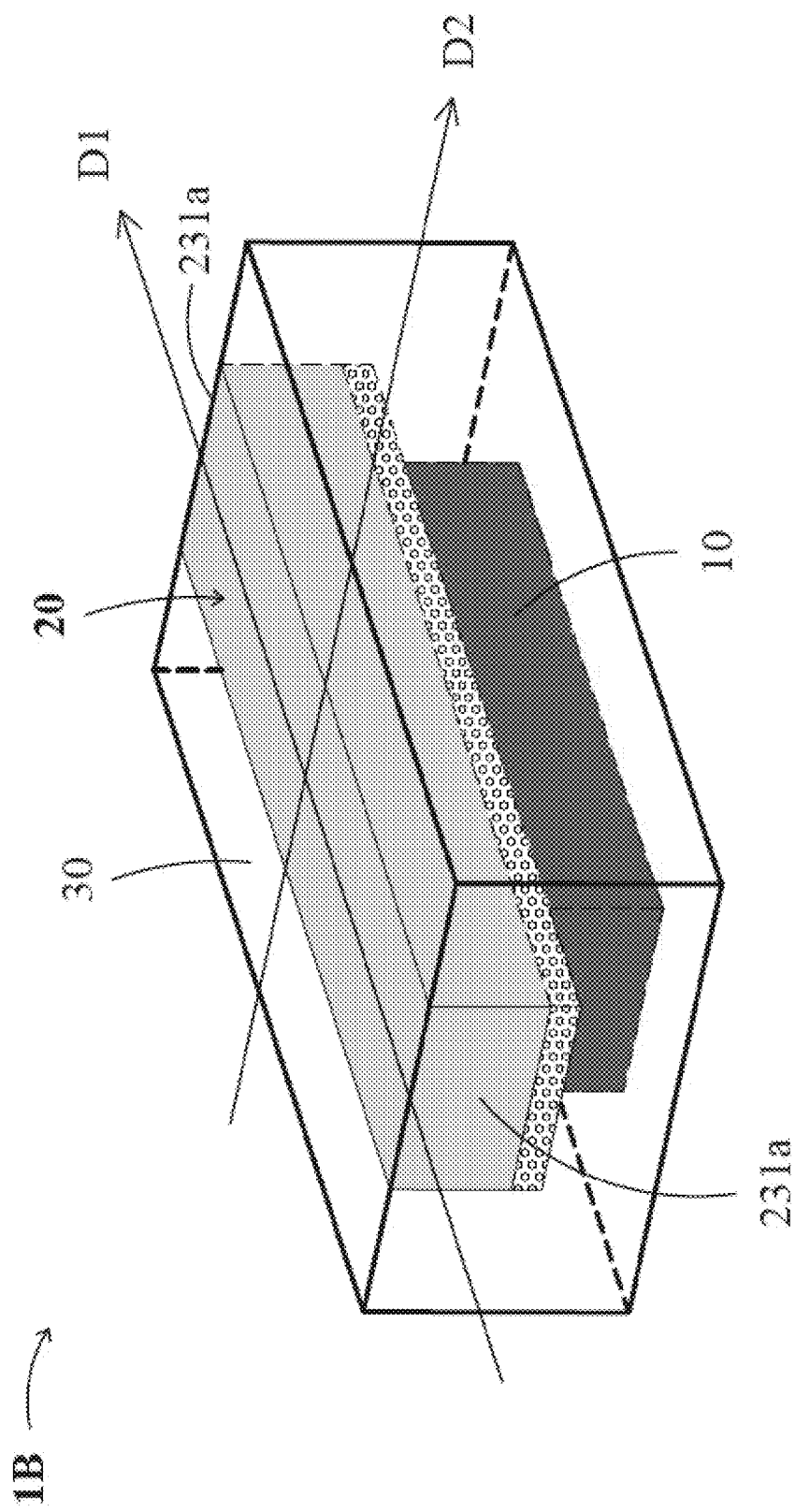
Figure 2C:
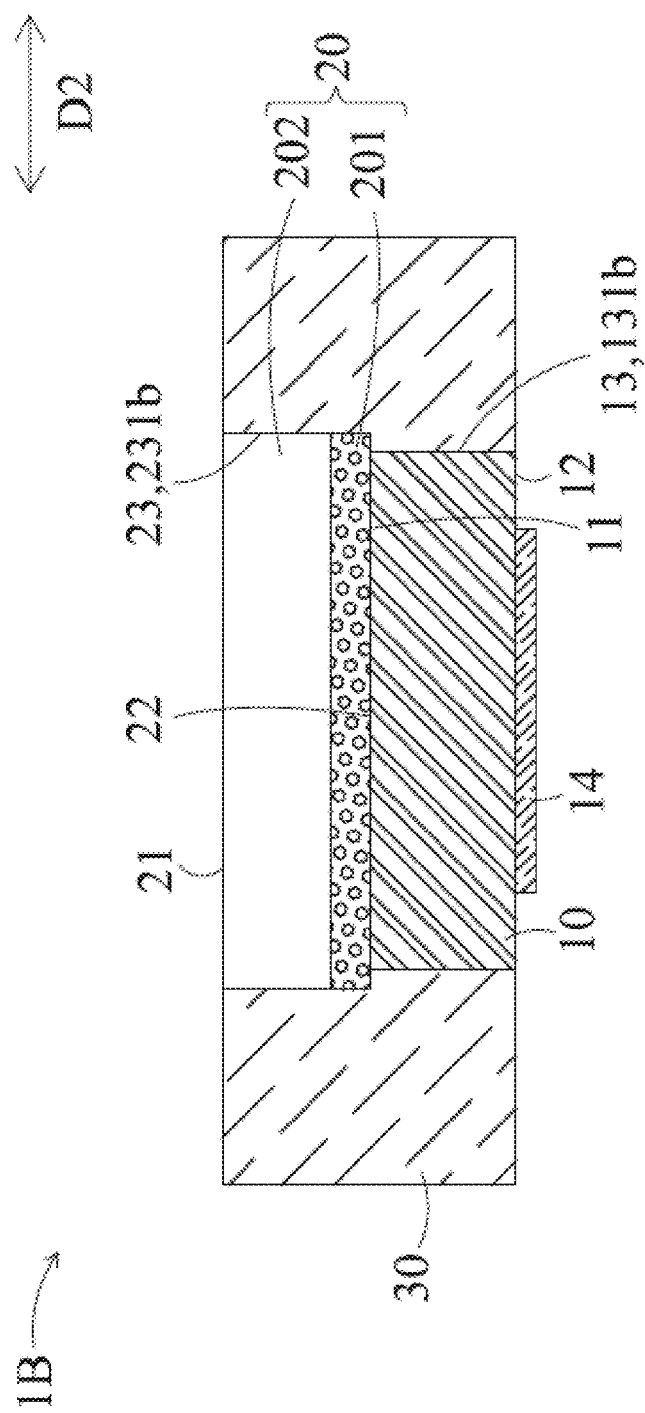
FIG. 2C, and FIG. 2D are schematic drawings in cross-sectional views depicting a CSP LED device according to another embodiment of the present disclosure.
Figure 2D:
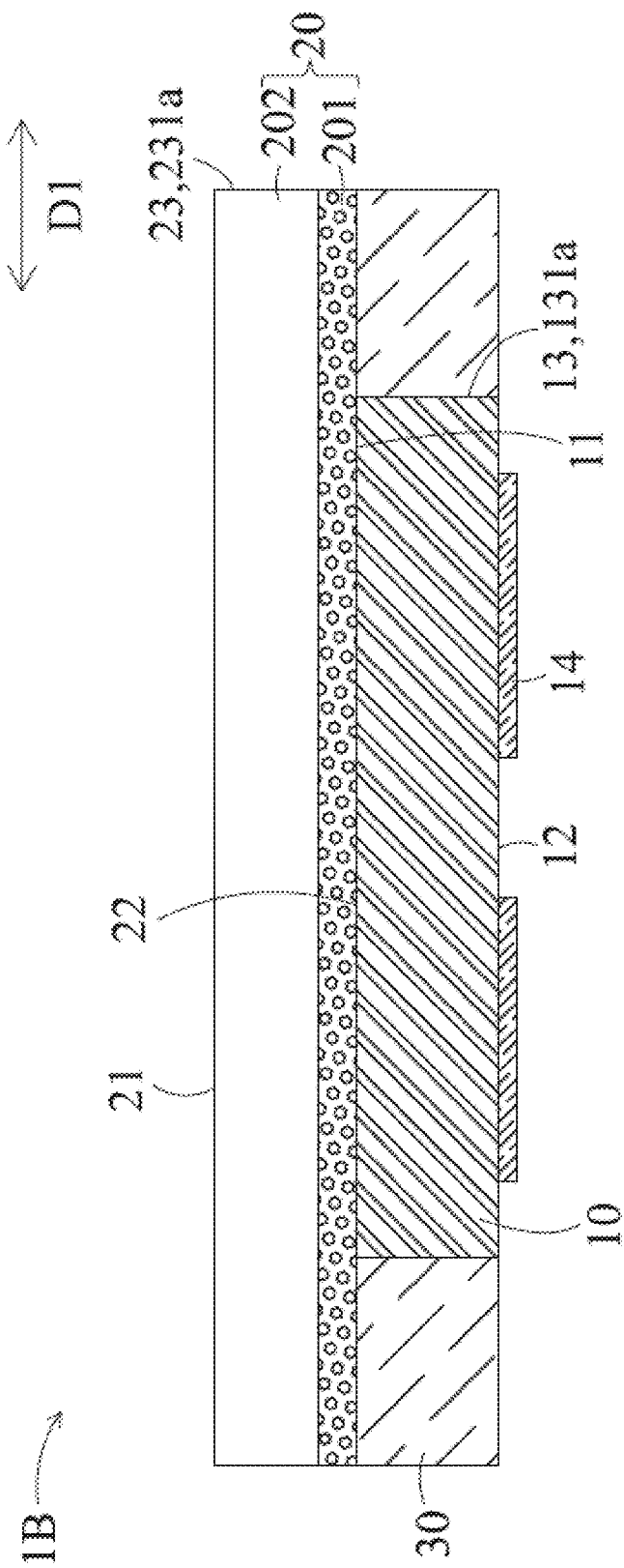

FIG. 2A and FIG. 2B are two schematic drawings in 3D perspective views, and FIG. 2C and FIG. 2D are two schematic drawings in cross-sectional views of a CSP LED device 1B according to another embodiment of the present disclosure. The difference between the CSP LED device 1B and the CSP LED device 1A is at least that the reflective structure 30 selectively covers one pair of side edges 231b as illustrated in the cross-sectional view with a cutting plane along the second horizontal direction D2 in FIG. 2C. On the other hand, the reflective structure 30 does not cover and exposes the other pair of side edges 231a of the photoluminescent structure 20, as illustrated in the cross-sectional view with a cutting plane along the first horizontal direction D1 in FIG. 2D. Another difference is that the surface area of the photoluminescent structure 20 of the CSP LED device 1B is larger than that of the LED semiconductor die 10. More specific technical contents are described as follows.

As viewed from the cutting plane along the first horizontal direction D1 (length direction) illustrated in FIG. 2D, the length of the lower surface 22 of the photoluminescent structure 20 is greater than the length of the upper surface 11 of the semiconductor die 10. Additionally, as viewed from the cutting plane along the second horizontal direction D2 (width direction) illustrated in FIG. 2C, the width of the lower surface 22 of the photoluminescent structure 20 is substantially the same as, or larger than, the width of the upper surface 11 of the semiconductor die 10. Desirably, the width of the lower surface 22 of the photoluminescent structure 20 is slightly larger than the width of the upper surface 11 of the semiconductor die 10 to avoid direct leakage of the light beam without passing through the photoluminescent structure 20.

The edge surface 23 of the photoluminescent structure 20 has two pairs of side edges 231, including the pair 231a and the other pair 231b. As shown in FIG. 2C, the pair of side edges 231b is perpendicular to the second horizontal direction D2 and is covered by the reflective structure 30. As shown in FIG. 2D, the other pair of side edges 231a is perpendicular to the first horizontal direction D1 and is not covered by the reflective structure 30. It will be appreciated that four side edges 131a and 131b of the edge surface 13 of the LED semiconductor die 10 are all covered by the reflective structure 30.

With this arrangement, when the light beam L is emitted from the LED semiconductor die 10, the light beam L (including the scattered light beam and the non-scattered light beam) travelling toward the pair of side edges 231b will be reflected back by the reflective structure 30, thus having a smaller viewing angle. On the other hand, the light beam L travelling toward the pair of side edges 231a will not be absorbed or reflected by the reflective structure 30, thus having a larger viewing angle.

In view of the above, the CSP LED device 1B, which can provide different viewing angles with respect to the first and the second horizontal directions, is suitable to applications specifying asymmetrical illuminations. As compared with the CSP LED device 1A, the CSP LED device 1B can provide a larger viewing angle along the first horizontal direction D1 since the pair of side edges 231a of the CSP LED device 1B is not covered by the reflective structure 30 with the cutting plane along the first horizontal direction D1.

Figure 3A:
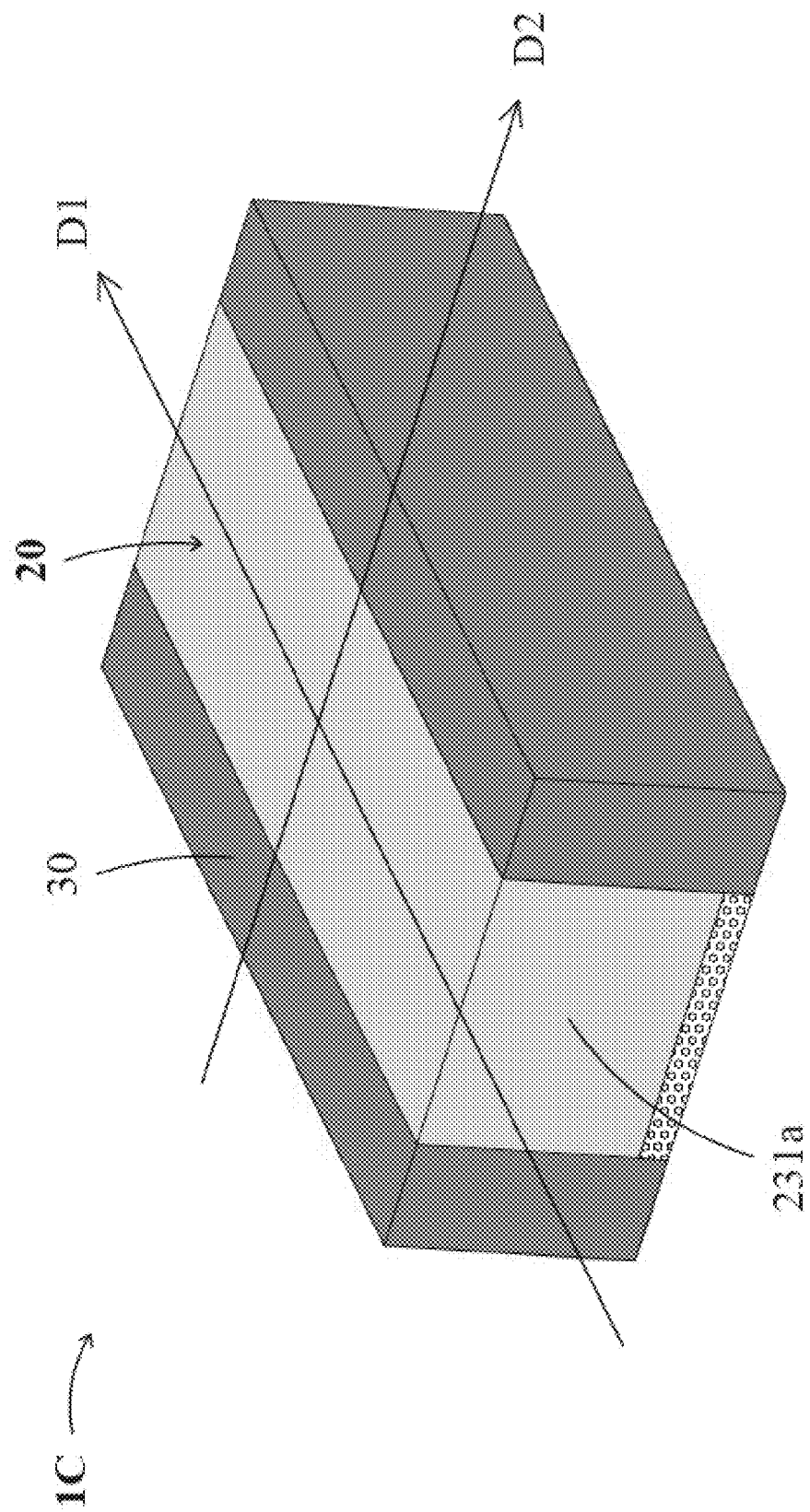
FIG. 3A and FIG. 3B are schematic drawings in 3D perspective views depicting a CSP LED device according to another embodiment of the present disclosure.
Figure 3B:
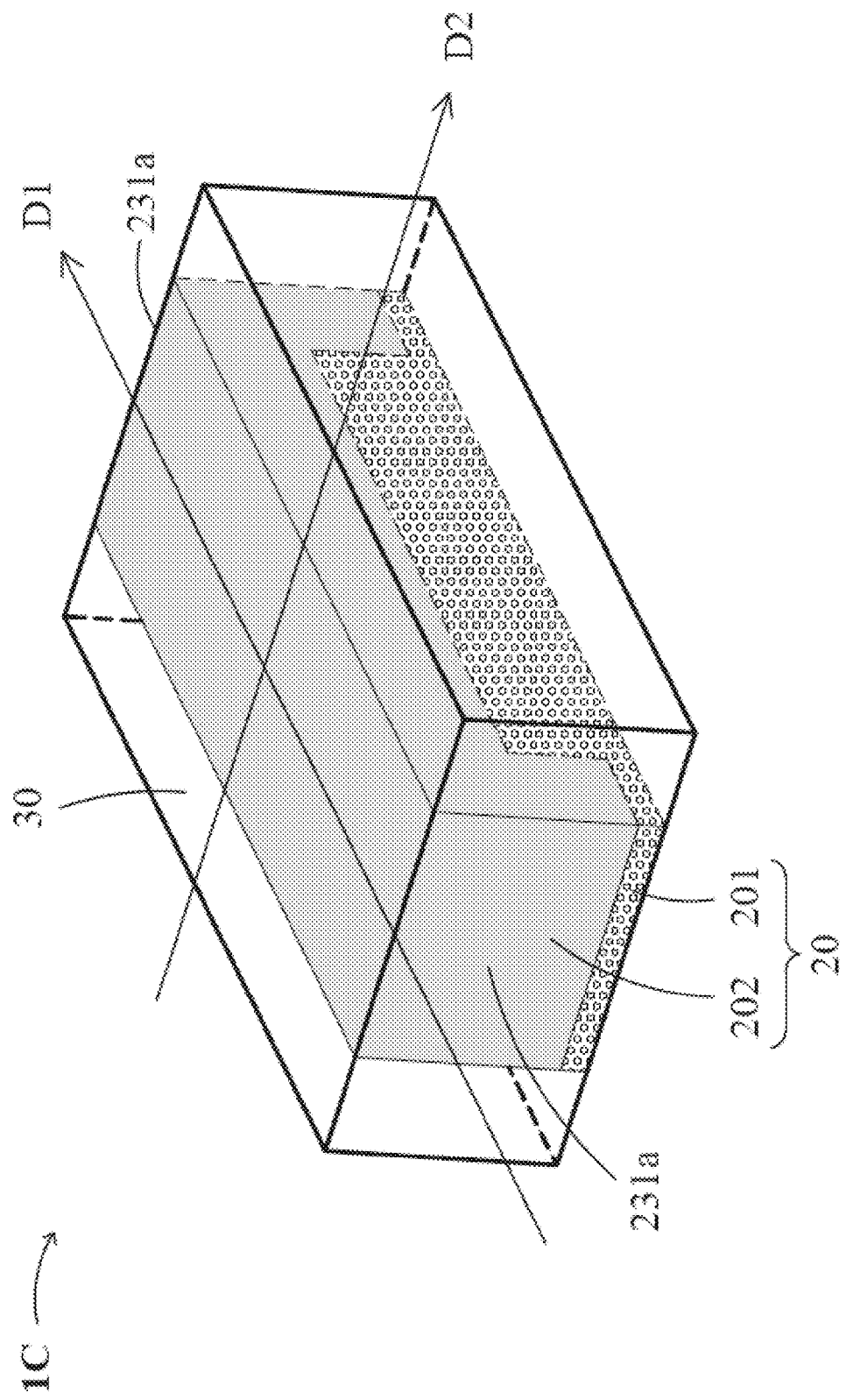
Figure 3C:
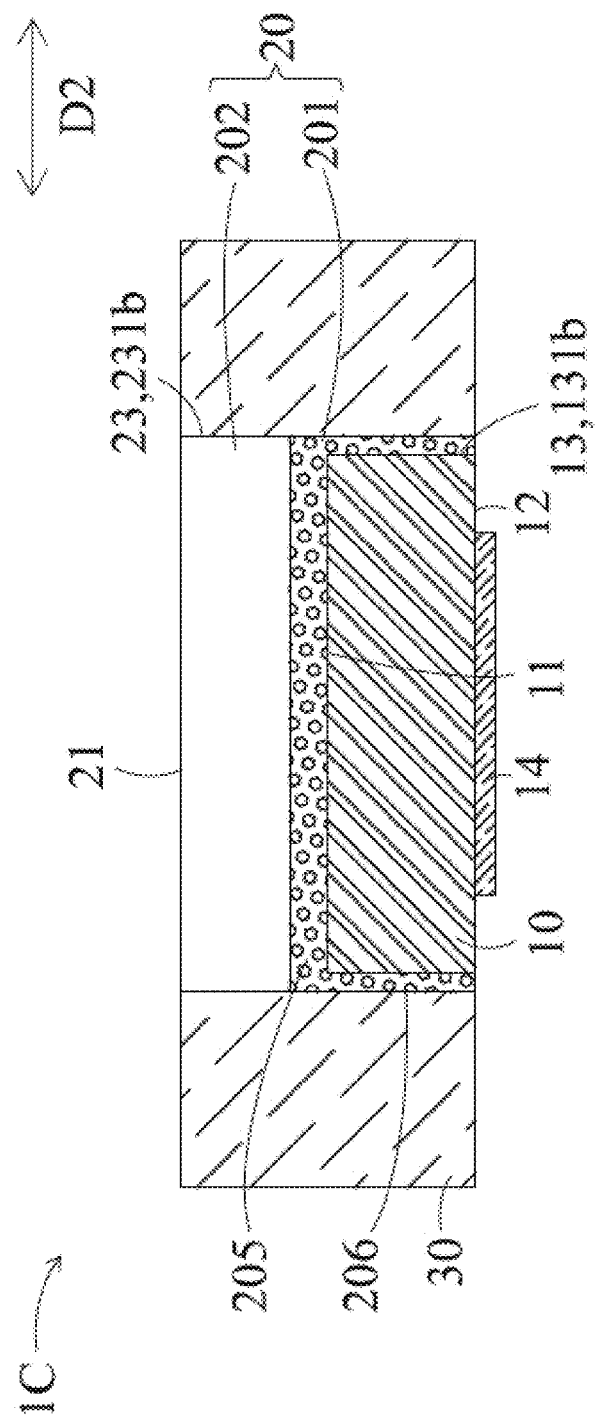
FIG. 3C, and FIG. 3D are schematic drawings in cross-sectional views depicting a CSP LED device according to another embodiment of the present disclosure.
Figure 3D:
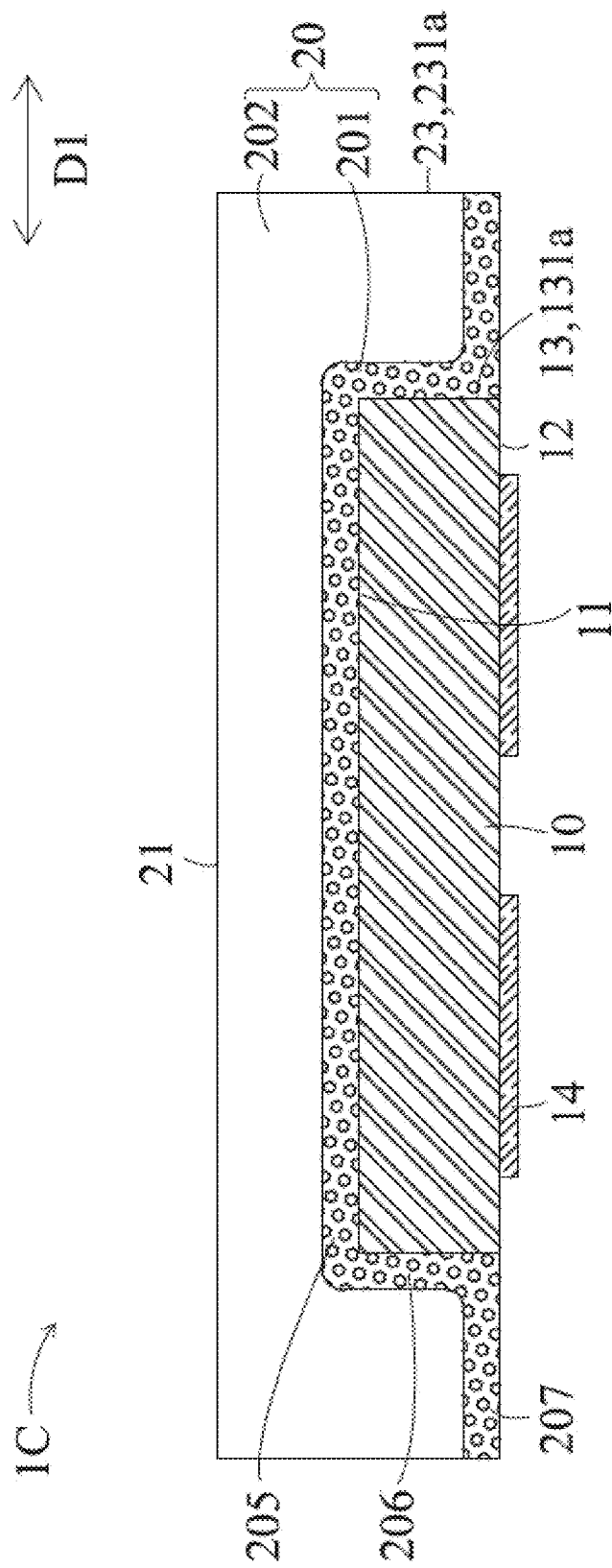

FIG. 3A and FIG. 3B are two schematic drawings in 3D perspective views, and FIG. 3C and FIG. 3D are two schematic drawings in cross-sectional views of a CSP LED device 1C according to another embodiment of the present disclosure. The difference between the CSP LED device 1C and the CSP LED device 1B is at least that some portion of the edge surface 13 of the LED semiconductor dies 10 of the CSP LED device 1C is not covered by the reflective structure 30 but is covered by the photoluminescent structure 20.

Specifically, as shown in FIG. 3C and FIG. 3D, the edge surface 13 comprises at least two pairs of side edges 131a and 131b. In addition to covering the upper surface 11 of the LED semiconductor die 10, the photoluminescent layer 201 further covers the side edges 131a and/or 131b and then extend outwardly. Thus, the photoluminescent layer 201 may be considered to include a top portion 205 covering the upper surface 11 of the LED semiconductor die 10, an edge portion 206 covering the side edges 131a and/or 131b, and an extension portion 207 extending outwardly from the edge portion 206 along the first horizontal direction D1 and/or the second horizontal direction D2. As a result, the light beam L emitted from the side edges 131a and/or 131b of the LED semiconductor die 10 passing through the edge portion 206 and the extension portion 207 along the first horizontal direction D1 and/or the second horizontal direction D2 can be down-converted into a lower energy light beam of different wavelength by the photoluminescent layer 201.

With the cutting plane along the second horizontal direction D2, as illustrated in FIG. 3C, the side edges 131b are first covered with the photoluminescent structure 20, which is further covered by the reflective structure 30. Desirably, the side edges 131b may be covered directly by the reflective structure 30 (not illustrated). With the cutting plane along the first horizontal direction D1, the side edges 131a are covered by the photoluminescent structure 20, but the photoluminescent structure 20 is not covered by the reflective structure 30. In other words, the reflective structure 30 is not used to restrict the viewing angle along the cutting plane aligned with the first horizontal direction D1.

In this way, as seen from the cutting plane along the first horizontal direction D1, the light beam L generated inside the LED semiconductor die 10 can be directly emitted from the LED semiconductor die 10 through the side edges 131a, and then emitted out of the CSP LED device 1C through the photoluminescent structure 20 without being reflected by the reflective structure 30. Therefore, along the first horizontal direction D1, the CSP LED device 1C provides a larger viewing angle. In contrast, along the second horizontal direction D2, since the light beam L is restricted by reflection due to the reflective structure 30, the CSP LED device 1C provides a smaller viewing angle. In view of the above, the CSP LED device 1C, which can provide different viewing angles with respect to the first and the second horizontal directions, is suitable to applications specifying asymmetrical illuminations.

Compared with the CSP LED device 1B, the CSP LED device 1C can further provide a larger viewing angle along the first horizontal direction D1 since the edge surface 13 of the LED semiconductor die 10 is not covered by the reflective structure 30 along the first horizontal direction D1.

Further, another variant of the CSP LED device 1C (not illustrated) is as follows: one side edge of the pair of the side edges 131b perpendicular to the second horizontal direction D2 is covered by the reflective structure 30, and one side edge of the other pair of the side edges 131a perpendicular to the first horizontal direction D1 is also covered by the reflecting structure 30. Thus, the radiation pattern of the light beam L along the second horizontal direction D2 itself is asymmetrical. Similarly, the radiation pattern along the first horizontal direction D1 itself is asymmetrical as well.

Figure 4A:
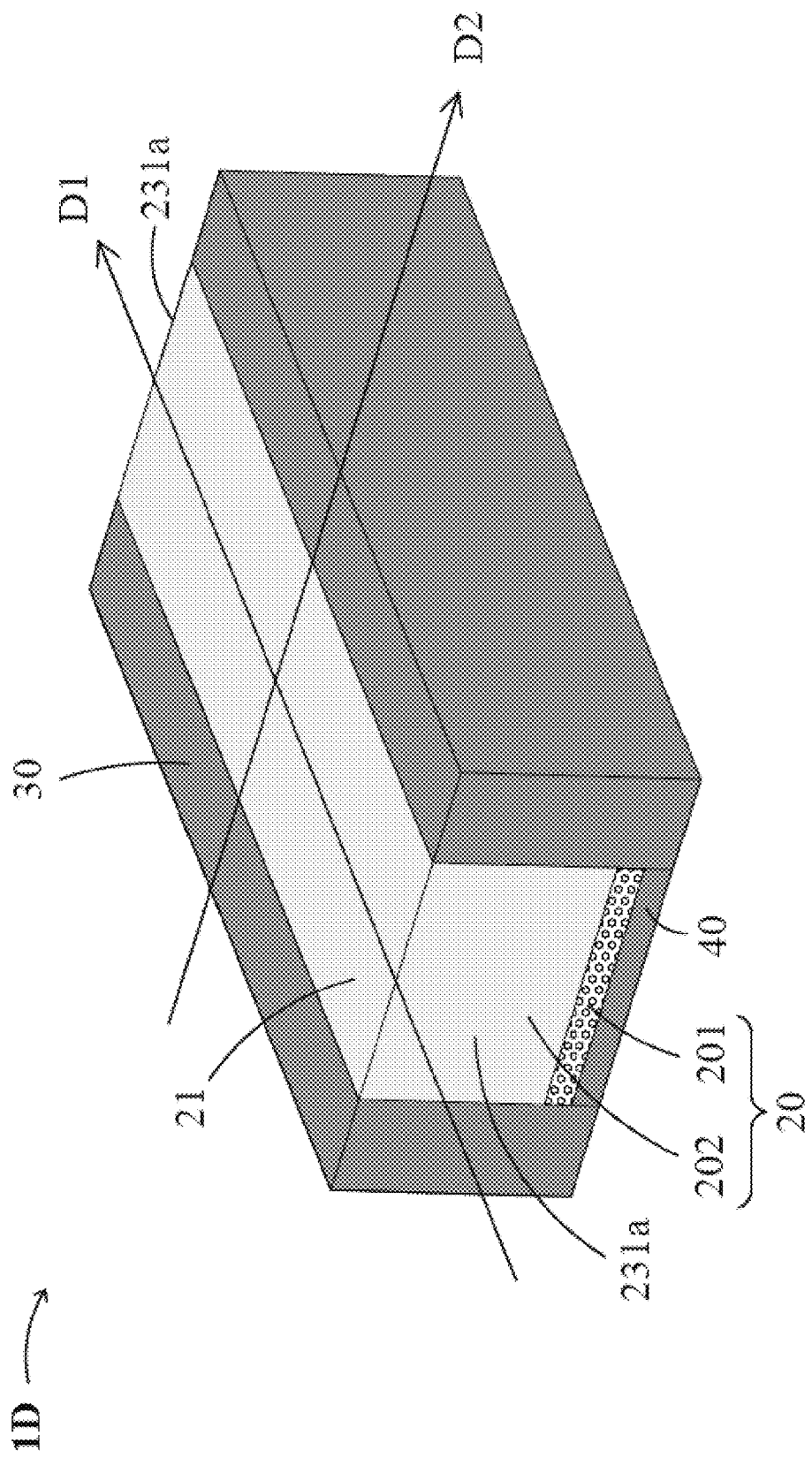
FIG. 4A and FIG. 4B are schematic drawings in 3D perspective views depicting a CSP LED device according to another embodiment of the present disclosure.
Figure 4B:
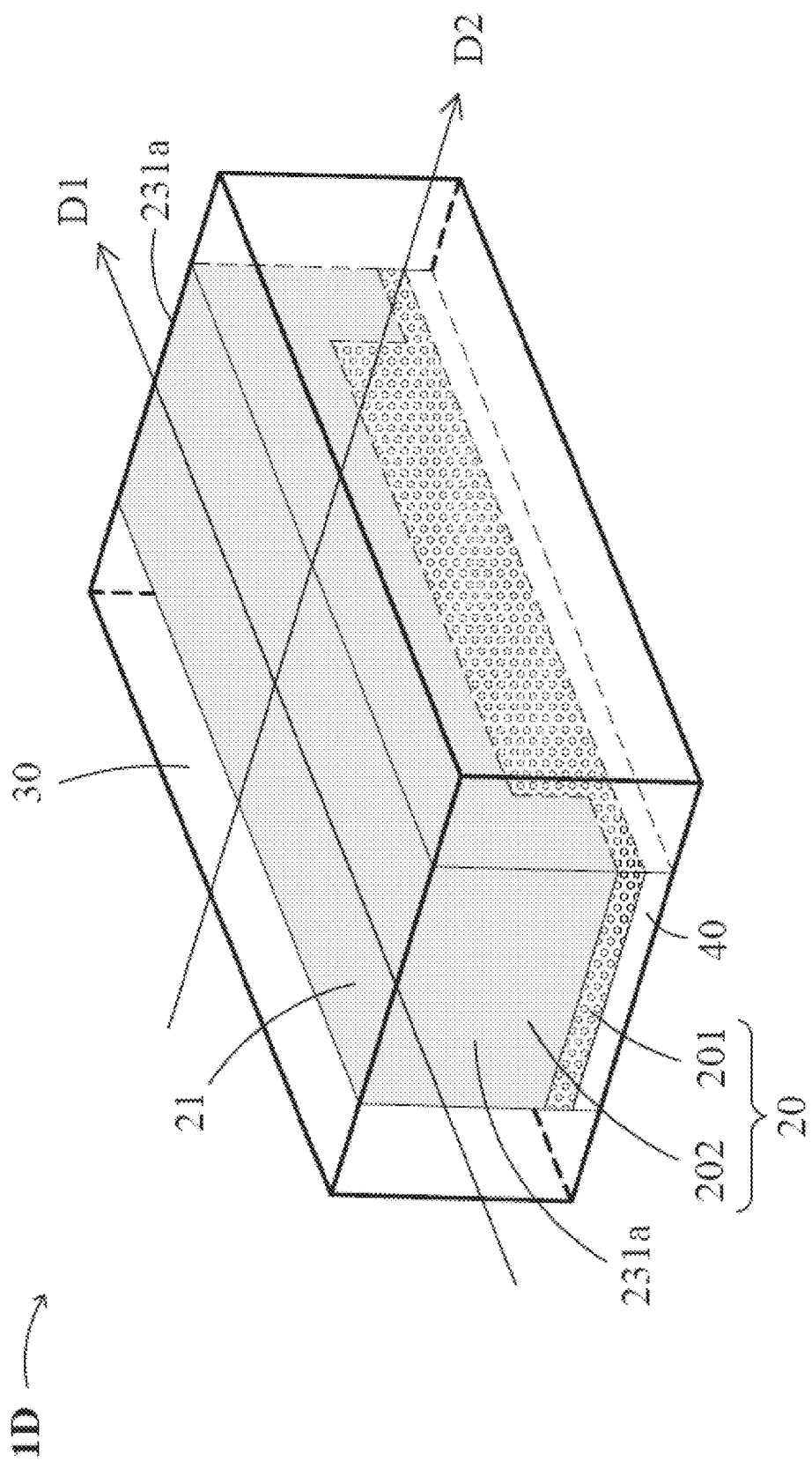
Figure 4C:
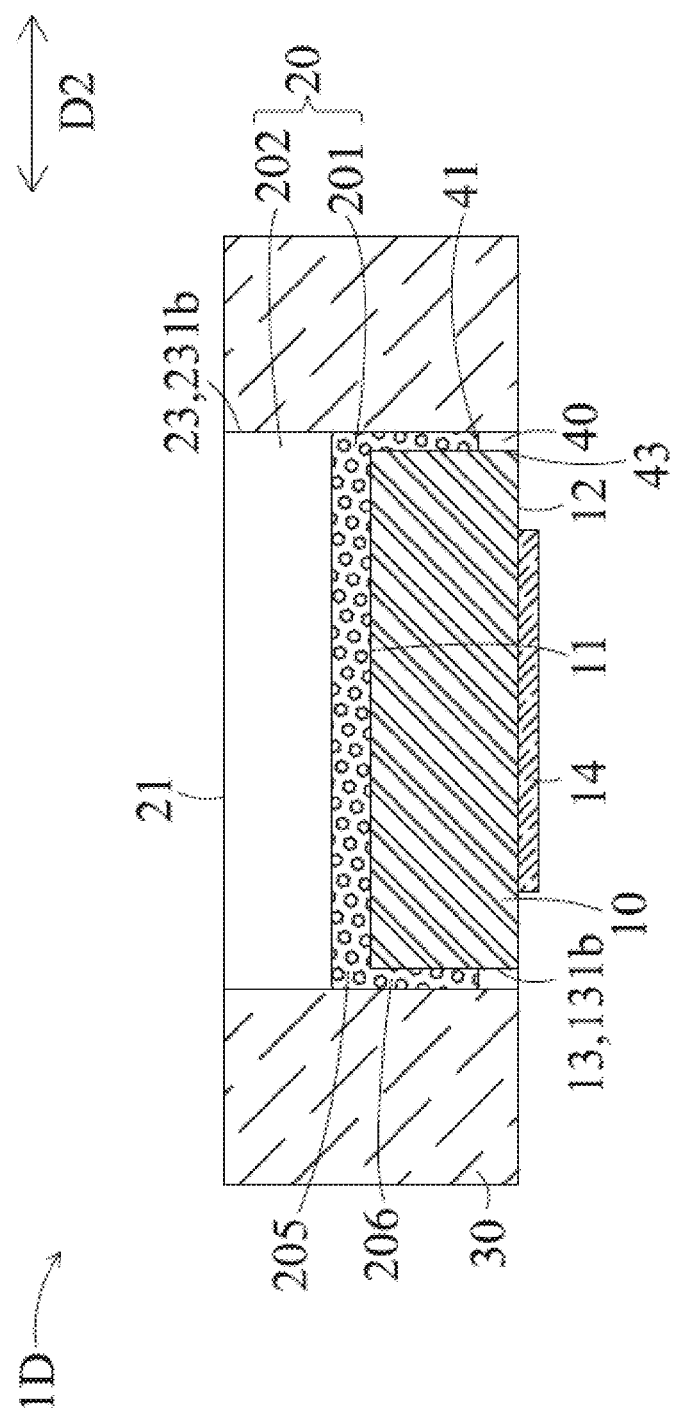
FIG. 4C and FIG. 4D are schematic drawings in cross-sectional views depicting a CSP LED device according to another embodiment of the present disclosure.
Figure 4D:
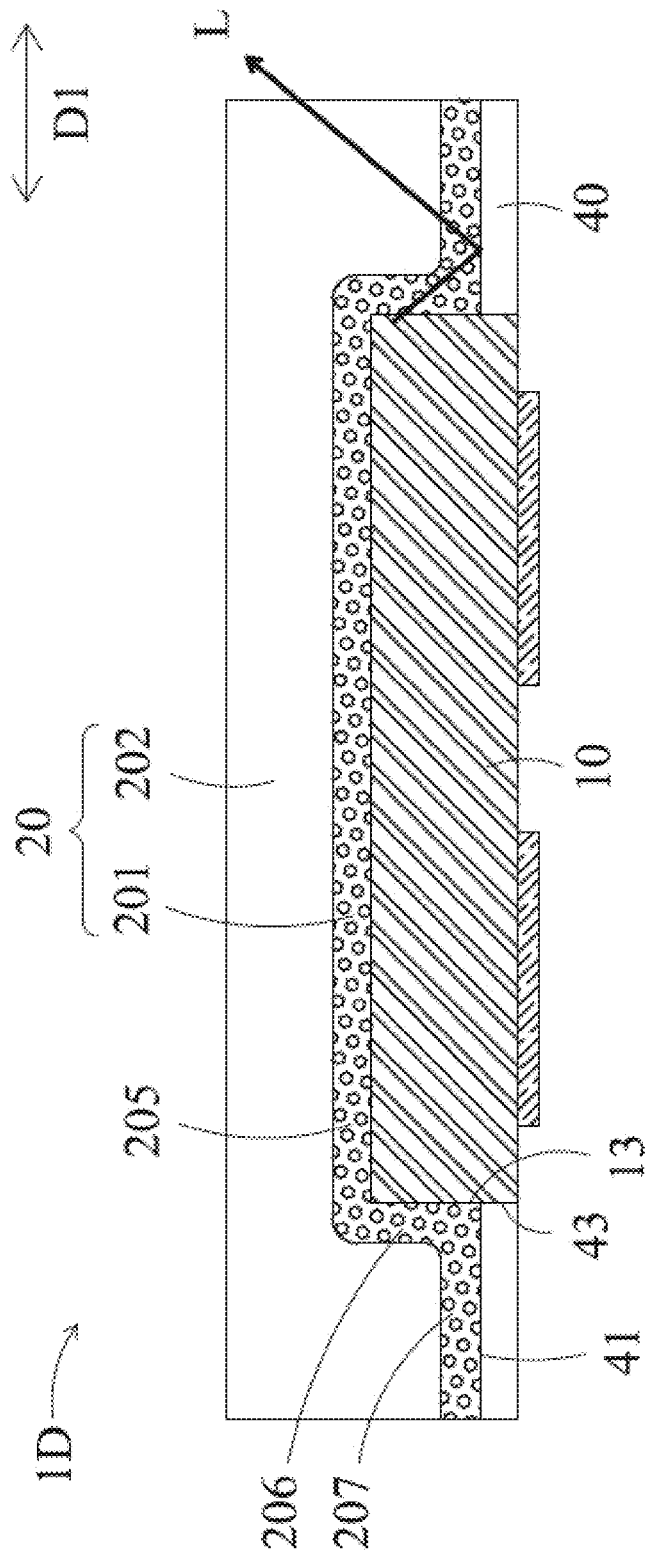

FIG. 4A and FIG. 4B are two schematic drawings in 3D perspective views, and FIG. 4C and FIG. 4D are schematic drawings in cross-sectional views of a CSP LED device 1D according to another embodiment of the present disclosure. The difference between the CSP LED device 1D and the CSP LED device 1C is at least that the CSP LED device 1D further includes a reflective under-layer 40 disposed underneath the photoluminescent layer 201 and covering at least a portion of the edge surface 13 of the LED semiconductor die 10. Desirably, the reflective under-layer 40 has an upper surface 41 adhering to both the edge portion 206 and the extension portion 207 of the photoluminescent layer 201, and an inner edge surface 43 adhering to the edge surface 13 of the LED semiconductor die 10. The thickness of the reflective under-layer 40 is not greater than the thickness of the LED semiconductor die 10.

After the light beam L emitted from the LED semiconductor die 10 travels into the photoluminescent layer 201, a portion of the light beam L is re-directed toward the extension portion 207 of the photoluminescent layer 201. Thus, the light beam L cannot be effectively utilized, causing energy loss of the light beam and lowering the luminous efficacy. By disposing the reflective under-layer 40 underneath the photoluminescent layer 201, the light beam L transmitted toward the extension portion 207 can be reflected by the reflective under-layer 40 so that the light beam L can be forced to escape out from the upper surface 21 and the pair of side edges 231a of the photoluminescent structure 20. Thus, the overall luminous efficiency of the CSP LED device 1D is improved.

Figure 5B:
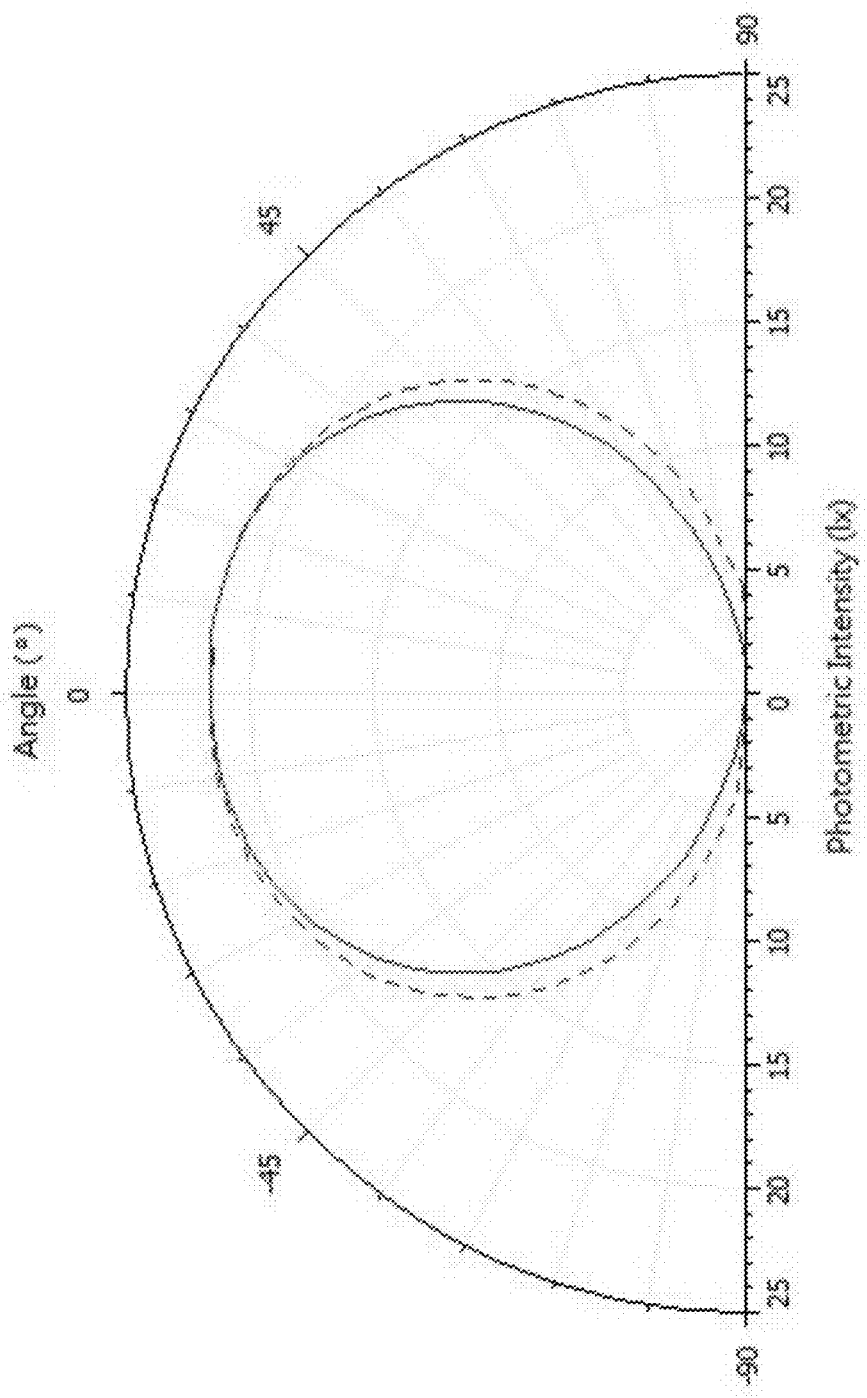
FIG. 5B is an example optical radiation pattern of a CSP LED device having an asymmetrical radiation pattern according to one embodiment of the present disclosure.

FIG. 5A and FIG. 5B show example optical measurement results of the light radiation pattern of CSP LED devices having a length of about 1500 μm and a width of about 1200 μm. FIG. 5A shows an optical measurement result of the light radiation pattern of a comparative top emitting CSP LED device. The light radiation patterns are very similar along the first horizontal direction D1 (length direction) and the second horizontal direction D2 (width direction), and both show a radiation angle of about 120 degrees at Full Width at Half Maximum (FWHM), thus having a symmetrical radiation pattern. FIG. 5B shows an optical measurement result of a light radiation pattern of the CSP LED device 1C with an asymmetrical radiation pattern according to the present disclosure. The light radiation pattern along the first horizontal direction D1 (length direction) has a radiation pattern profile considerably different from that along the second horizontal direction D2 (width direction). The measured FWHM is about 135 degrees along the first horizontal direction D1, and about 122 degrees along the second horizontal direction D2, showing an asymmetrical light radiation pattern.

Thus, CSP LED devices 1A, 1B, 1C, and 1D provide at least the following benefits. Since an asymmetrical light radiation pattern is achievable without introducing a primary optical lens or a secondary optical lens, the overall manufacturing cost is reduced in some applications specifying an asymmetrical light source. Further, the space to incorporate the optical lens is saved as well. Moreover, a compact form factor of the CSP LED device having an asymmetrical radiation pattern facilitates more compact design for consumer electronic products. Thus, the CSP LED device having an asymmetrical radiation pattern can be introduced as a light source for a backlight unit of the edge-lit LED TV or the display panel for a portable electronic device. The asymmetrical radiation pattern provides a large viewing angle radiation pattern along the length direction of light-guide plate of the backlight unit, thus resulting in a more uniform light distribution. Therefore the edge-lit light source can reduce dark spots inside the light-guide plate, or alternatively increasing the pitch distance between two adjacent CSP LED devices to reduce the quantity of the CSP LED devices included. Further, the asymmetrical radiation pattern provides a small viewing angle light radiation pattern along the thickness direction of the light-guide plate, so that the incident light beam irradiated from the CSP LED device can penetrate into the thin light-guide plate with a higher transmission efficiency, thus reducing light beam loss.

In addition, the technical contents of forming a monochromatic CSP LED device having an asymmetrical radiation pattern disclosed by the LED device 1A is also applicable to the CSP LED devices 1B, 1C, and 1D. Other technical contents such as further including a micro-lens array layer or a submount substrate is applicable to the CSP LED devices 1B, 1C, and 1D as well.

Next, manufacturing methods to fabricate various embodiments of the CSP LED devices according to the present disclosure are described. Generally, the manufacturing methods include at least two main fabrication stages: disposing a photoluminescent structure on an LED semiconductor die, and covering at least one side of the edge surface of the photoluminescent structure and at least the same side of the edge surface of the LED semiconductor die. The technical contents of the manufacturing method are further described as follows.

FIG. 6A to FIG. 8C show a manufacturing method to fabricate the embodiment of the CSP LED device 1A according to the present disclosure.

Figure 6A:
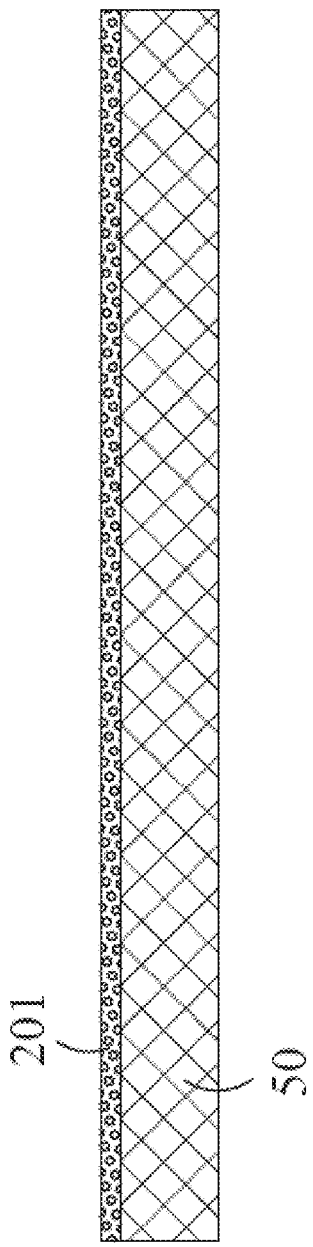
Figure 6B:
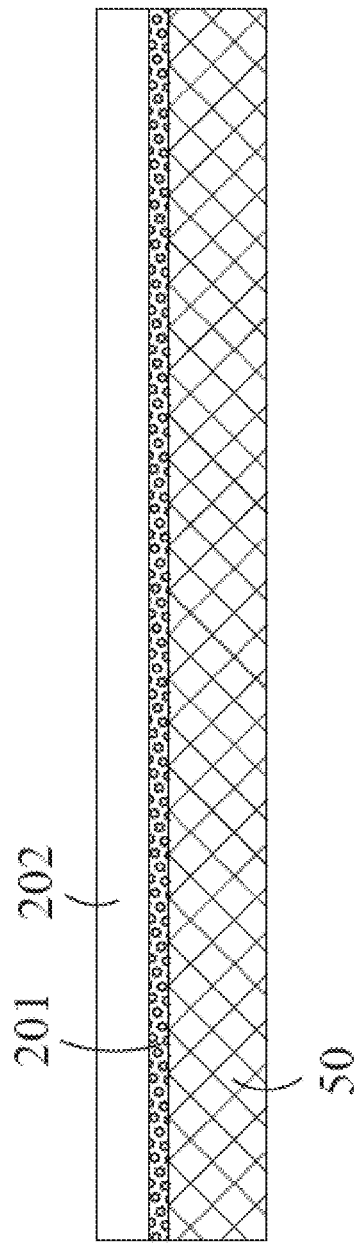
Figure 6C:
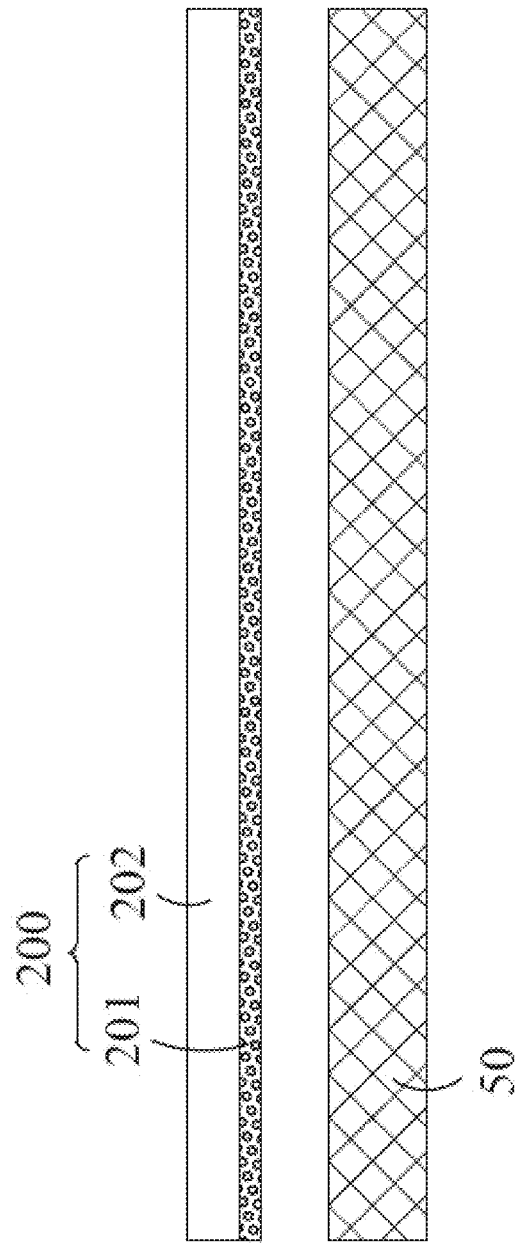

The photoluminescent structure 20 can be formed first prior to the fabrication stage of disposing the photoluminescent structure 20 on the LED semiconductor die 10. Specifically, as shown in FIG. 6A, a photoluminescent layer 201 is firstly formed on a release layer 50. Then, as shown in FIG. 6B, a supernatant light-transmitting layer 202 is formed stacked up on the photoluminescent layer 201. As shown in FIG. 6C, the release layer 50 is removed so that a photoluminescent sheet 200 composed of the supernatant light-transmitting layer 202 and the photoluminescent layer 201 is fabricated. The aforementioned formation of the photoluminescent layer 201 and the supernatant light-transmitting layer 202 can be achieved by way of spray coating, printing, dispensing, molding, or the like. Desirably, the photoluminescent layer 201 can be formed by a method disclosed in U.S. patent publication US2010/0119839.

Figure 6E:
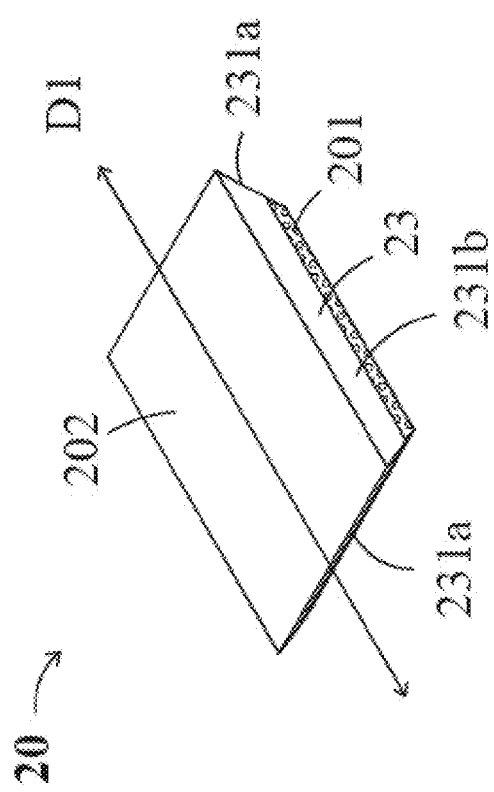

When the photoluminescent sheet 200 is formed, a singulation process follows to separate the photoluminescent sheet 200 into a plurality of photoluminescent structures 20, particularly to form a photoluminescent structure 20 having at least one pair of the beveled side edges 231a or 231b of the edge surface 23. An example singulation process is a punching process to disjoin or separate the photoluminescent sheet 200 into a plurality of the photoluminescent structures 20 with a desired beveled edge surface. Specifically, as shown in FIG. 6D, the photoluminescent sheet 200 is reversely placed on another release layer (not illustrated), and then punched by a punching tool 60. The punching tool 60 comprises an array of punching blades 61, which are connected to one another and arranged according to a desired geometric shape of the photoluminescent structure 20, such as a square array. Therefore, a plurality of the photoluminescent structures 20 can be made of the photoluminescent sheet 200 with a single punching process using the punching tool 60. As shown in FIG. 6E, the pair of side edges 231a of the photoluminescent structure 20 is beveled. In place of a punching process, a sawing or molding process can be used.

Furthermore, a slanted angle of the beveled side edges 231a of the photoluminescent structure 20 can be pre-determined by several design factors, such as the blade angle profile, the geometric dimensions of the photoluminescent structure 20, the elastic or plastic material properties of the photoluminescent sheet 200, and so forth. These factors can be pre-designed to obtain a desired slanted angle of the beveled side edges 231a. A specific technical description of the slanted angle of the side edges 231a is disclosed in U.S. patent application Ser. No. 15/280,927 (also published as Taiwan patent application number 104132711), the technical contents are hereby incorporated by reference in its entirety.

Figure 7B:
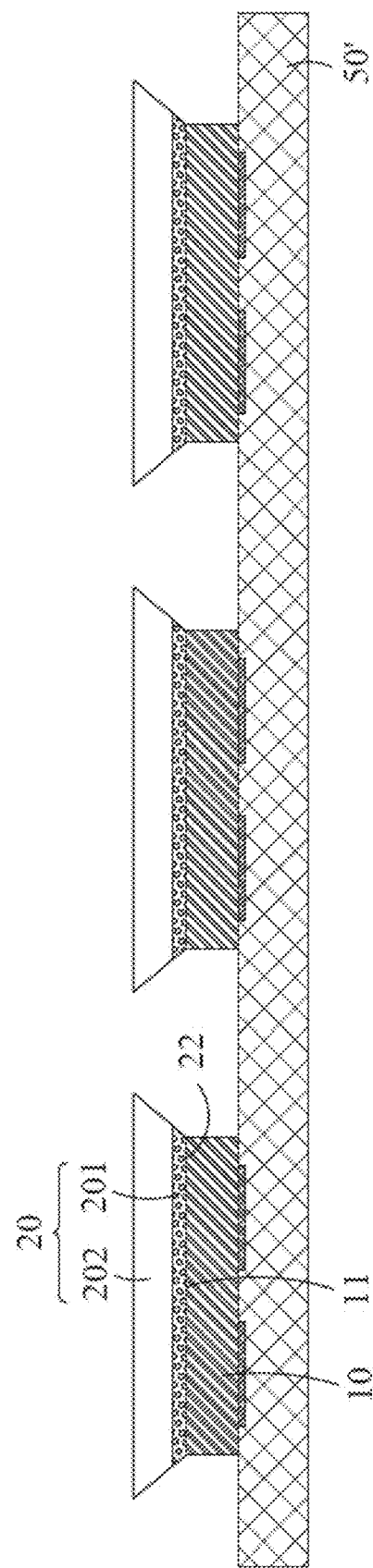

After the photoluminescent structure 20 is formed, it can be disposed onto the LED semiconductor die 10. Specifically, as shown in FIG. 7A, a plurality of LED semiconductor dies 10 are arranged on a release layer 50' as an array of LED semiconductor dies 10 with a fixed distance of pitch. An example embodiment of the release layer 50' is an ultraviolet (UV) light release tape, a thermal release tape, or the like. It is desired that each set of electrodes 14 of the array of the LED semiconductor dies 10 is placed and pressed forcefully so that they are embedded inside the soft release layer 50'. This will protect the set of electrodes 14 against contamination during subsequent processing. Then, as show in FIG. 7B, an array of the photoluminescent structures 20 are subsequently attached onto upper surfaces 11 of the pre-arranged array of LED semiconductor dies 10. It is desired that the attachment process is precisely controlled and aligned so that the lower surface 22 of the photoluminescent structure 20 substantially fully covers the upper surface 11 of the LED semiconductor die 10. The photoluminescent structure 20 can be joined to the upper surface 11 of the LED semiconductor die 10 using an adhesive material or an adhesive tape. Therefore, an electro-luminescent structure, comprising the LED semiconductor die 10 and the photoluminescent structure 20, is formed, wherein the photoluminescent layer 201 is sandwiched between the supernatant light-transmitting layer 202 and the upper surface 11 of the LED semiconductor die 10.

Figure 8A:
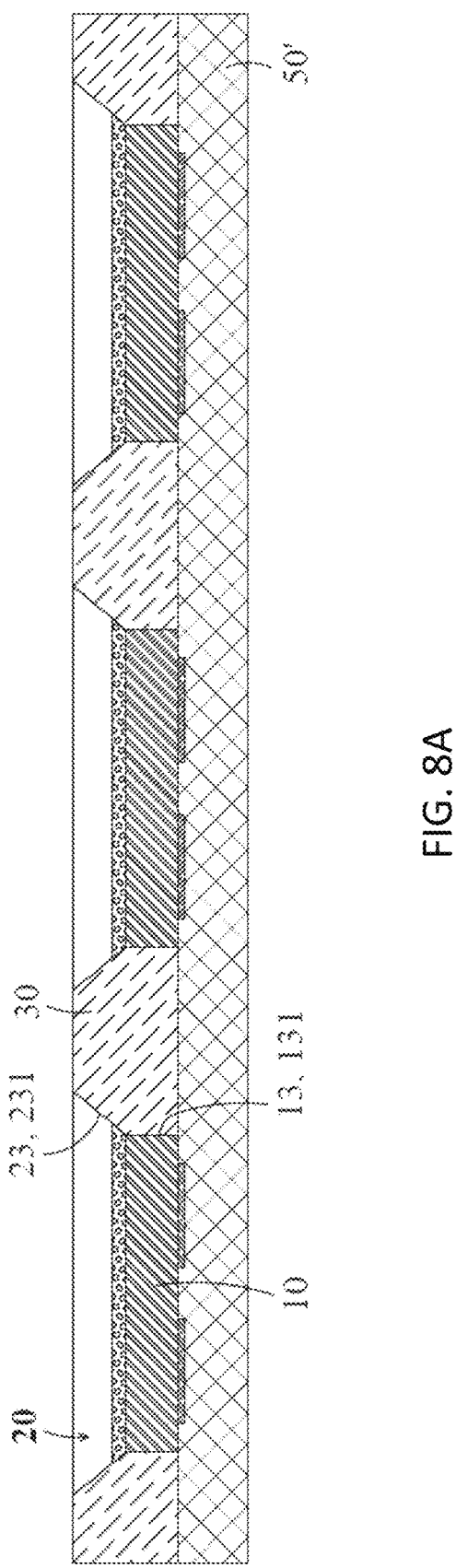

Next, a fabrication process of forming a reflective structure 30 surrounding the electro-luminescent structure is described as follows. Specifically, as shown in FIG. 8A, a resin material to fabricate the reflective structure 30 is disposed surrounding the edge surface 13 of the LED semiconductor die 10 and the edge surface 23 of the photoluminescent structure 20 simultaneously to form the reflective structure 30. An example disposing method is a molding process or a dispensing process. In the present embodiment, the two pairs of the side edges 231 of the edge surface 23 and the two pairs of the side edges 131 of the edge surface 13 are all covered by the reflective structure 30.

If the reflective structure 30 is fabricated using a molding process, an array of the electro-luminescent structures pre-arranged on the release layer 50' can be placed inside a mold (not illustrated), and then the resin material to fabricate the reflective structure 30 may be injected into the mold surrounding both the edge surface 23 of the photoluminescent structure 20 and the edge surface 13 of the LED semiconductor die 10. The reflective structure 30 is then formed after curing the resin material.

If the reflective structure 30 is fabricated using a dispensing process, a mold may be omitted. An example dispensing method is: firstly, a resin material used to fabricate the reflective structure 30 is dispensed, for example, using a needle syringe to directly dispense the resin material into the gap among the array of the electro-luminescent structures pre-arranged on top of the release layer 50'. Secondly, the dispensed volume is gradually increased until it substantially fully covers the edge surface 13 of the LED semiconductor die 10 and the edge surface 23 of the photoluminescent structure 20. It will be appreciated that the amount of the reflector resin material is controlled precisely so that it will not be over-spilled to contaminate the upper surface 21 of the photoluminescent structure 20. Finally, the reflective structure 30 is formed after curing the resin material.

Figure 8B:
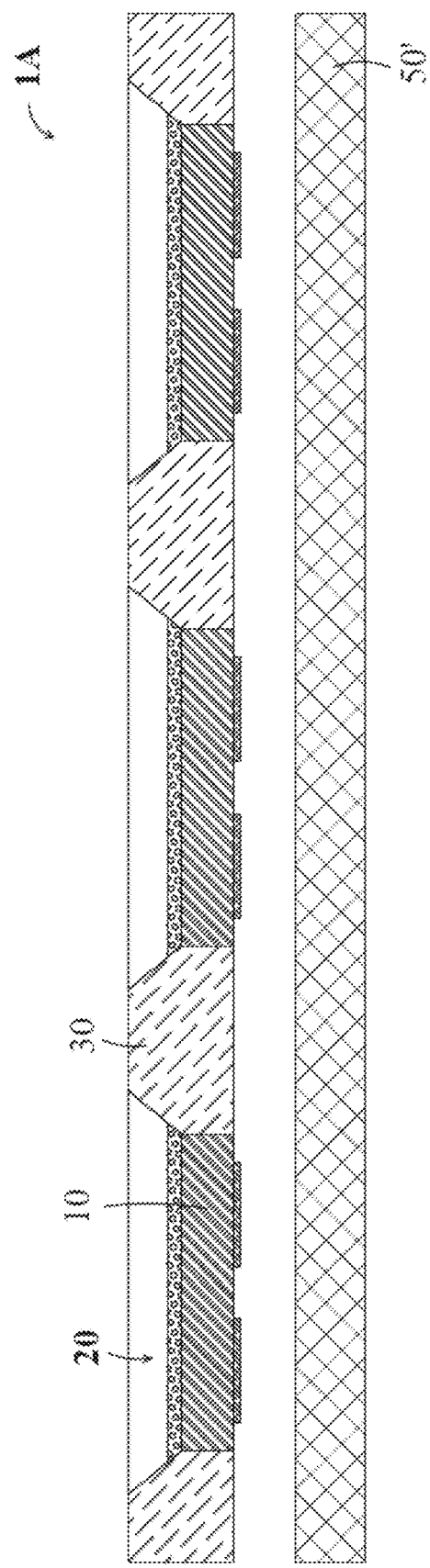
Figure 8C:
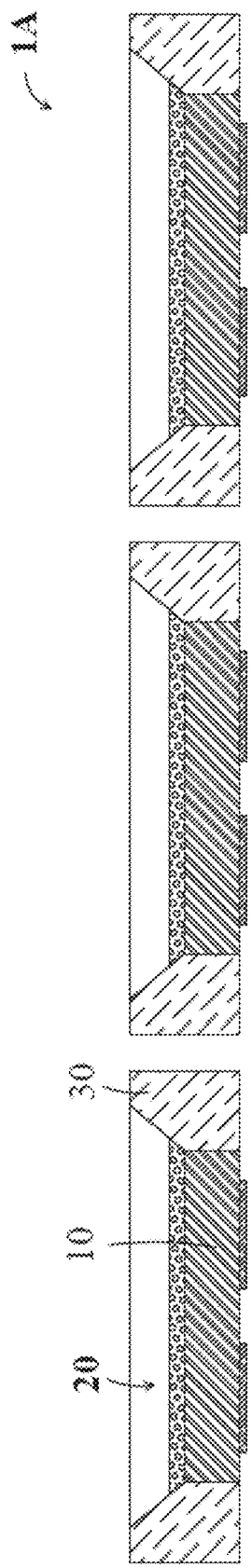

After the formation of the reflective structure 30, lastly, a singulation process is disclosed. Once the reflective structure 30 is formed, as shown in FIG. 8B, the release layer 50' can be removed to obtain an array of the CSP LED devices 1A. A dicing process, as shown in FIG. 8C, is used to singulate the reflective structure 30 along the first horizontal direction D1 and the second horizontal direction D2 to obtain a plurality of the CSP LED devices 1A.

The aforementioned paragraphs are detailed descriptions of the manufacturing method to fabricate the embodiment of the CSP LED device 1A according to the present disclosure. Detailed descriptions of other manufacturing methods to fabricate other embodiments of the CSP LED devices are explained as follows. It will be appreciated that some detailed descriptions found in the following manufacturing methods are similar to those of the manufacturing method for the CSP LED device 1A and are therefore omitted for the purpose of brevity.

FIG. 9A to FIG. 12B show various fabrication stages of a manufacturing method for the embodiment of the CSP LED device 1B according to the present disclosure.

Figure 9A:
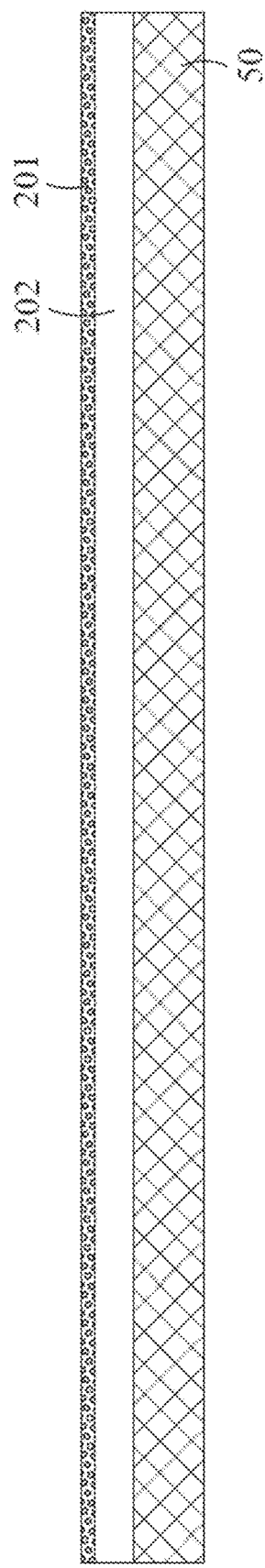
FIG. 9A, FIG. 9B, FIG. 10A, FIG. 10B, FIG. 10C, FIG. 11A, FIG. 11B, FIG. 12A, and FIG. 12B are schematic drawings illustrating a manufacturing process to fabricate a CSP LED device according to another embodiment of the present disclosure.

As shown in FIG. 9A, a release layer 50 is first prepared, and the supernatant light-transmitting layer 202 and the photoluminescent layer 201 are sequentially disposed stacked up on the release layer 50 by using a fabrication process such as spraying, printing, or molding. An alternative approach could be used to fabricate a photoluminescent sheet first, including the supernatant light-transmitting layer 202 and the photoluminescent layer 201. Then the photoluminescent sheet is placed on the release layer 50 with the photoluminescent layer 201 facing upward.

Figure 9B:
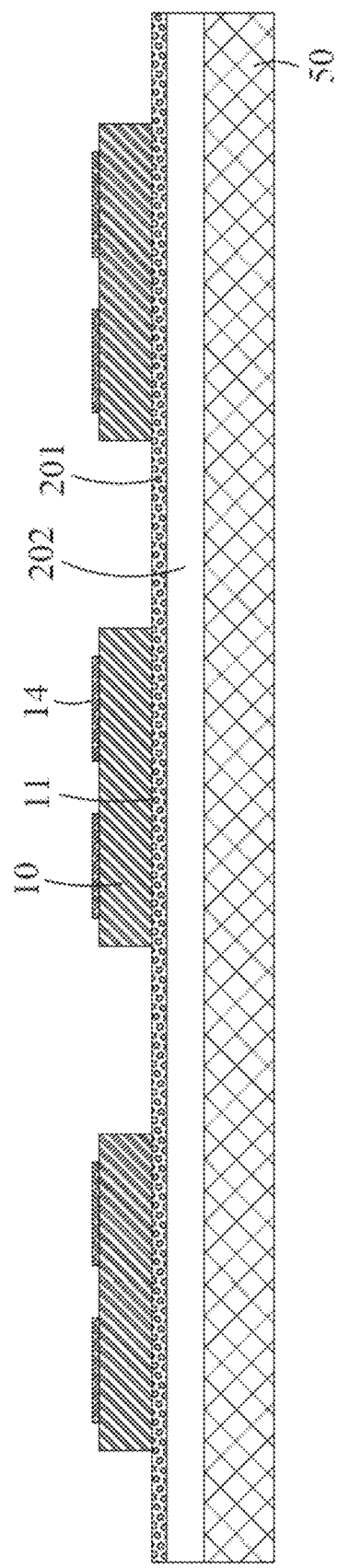

Next, as shown in FIG. 9B, a plurality of LED semiconductor dies 10 are arranged on the photoluminescent layer 201 as an array so that the upper surface 11 of the LED semiconductor die 10 is facing downward so that it is covered by the photoluminescent layer 201. In other words, the set of electrodes 14 of the LED semiconductor die 10 is facing upward. Thus, an array of the reversely placed LED semiconductor dies 10 with a fixed distance of pitch is formed.

Figure 10A:
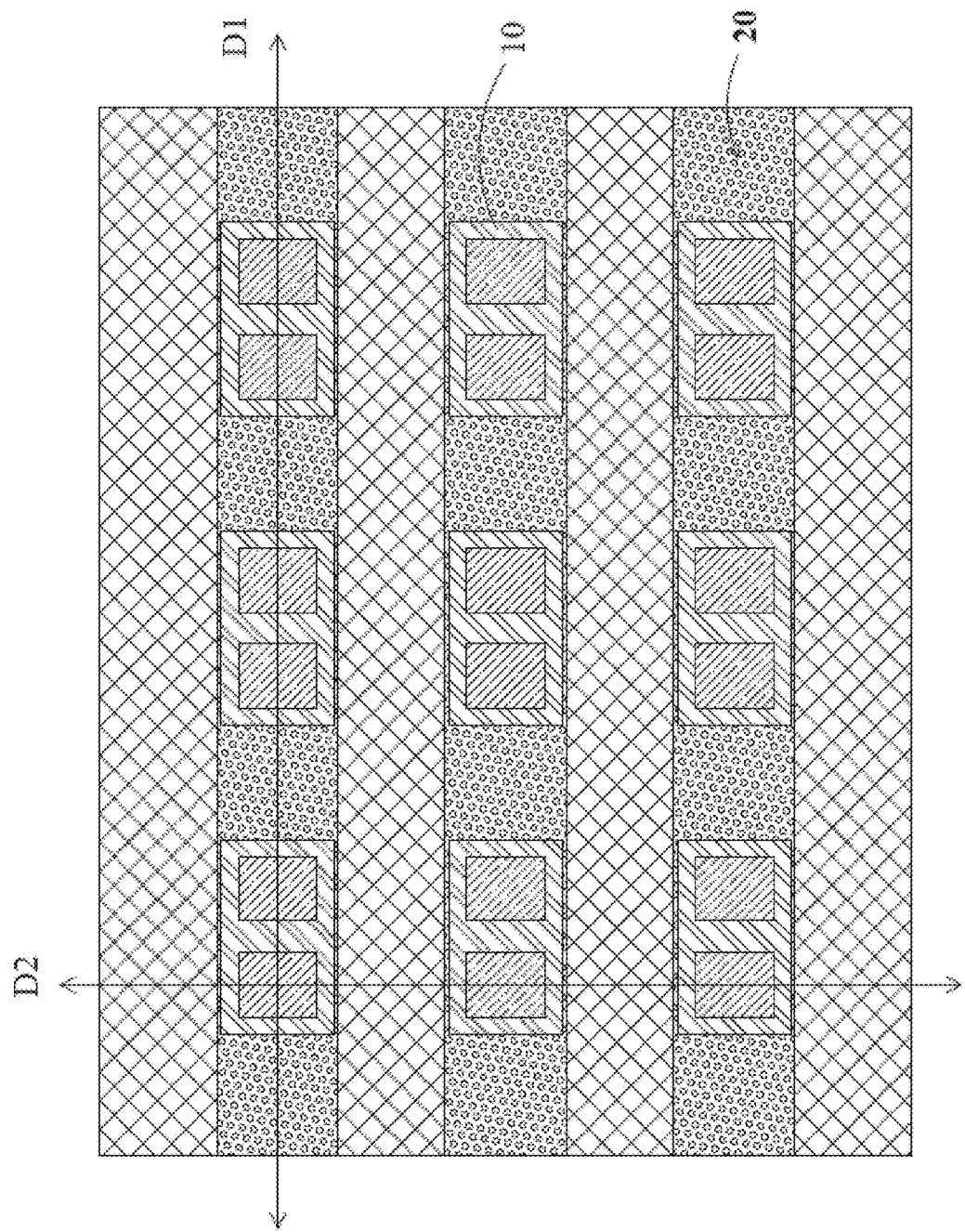
Figure 10B:
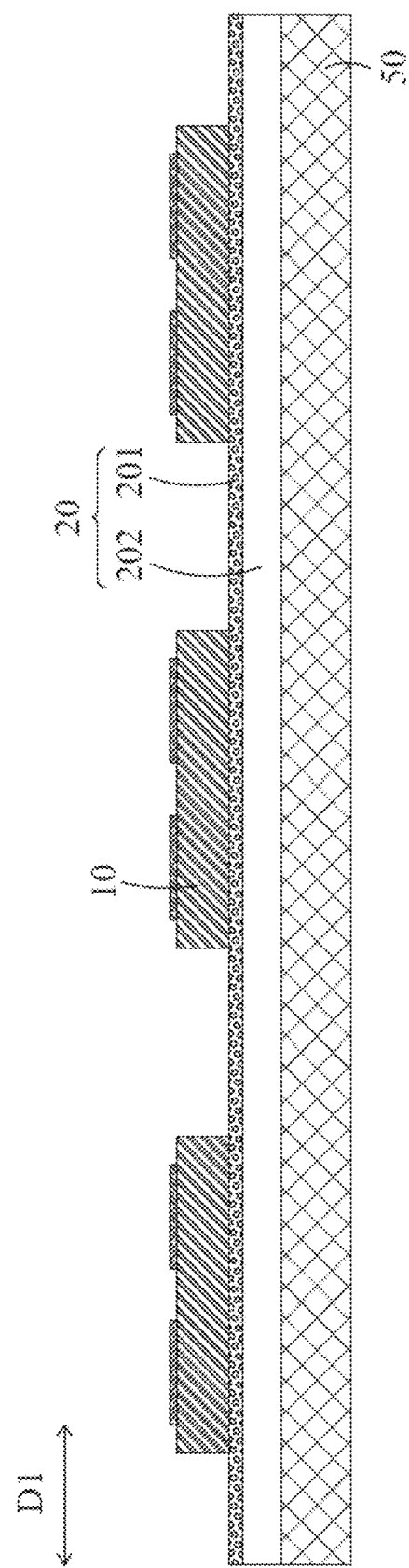
Figure 10C:
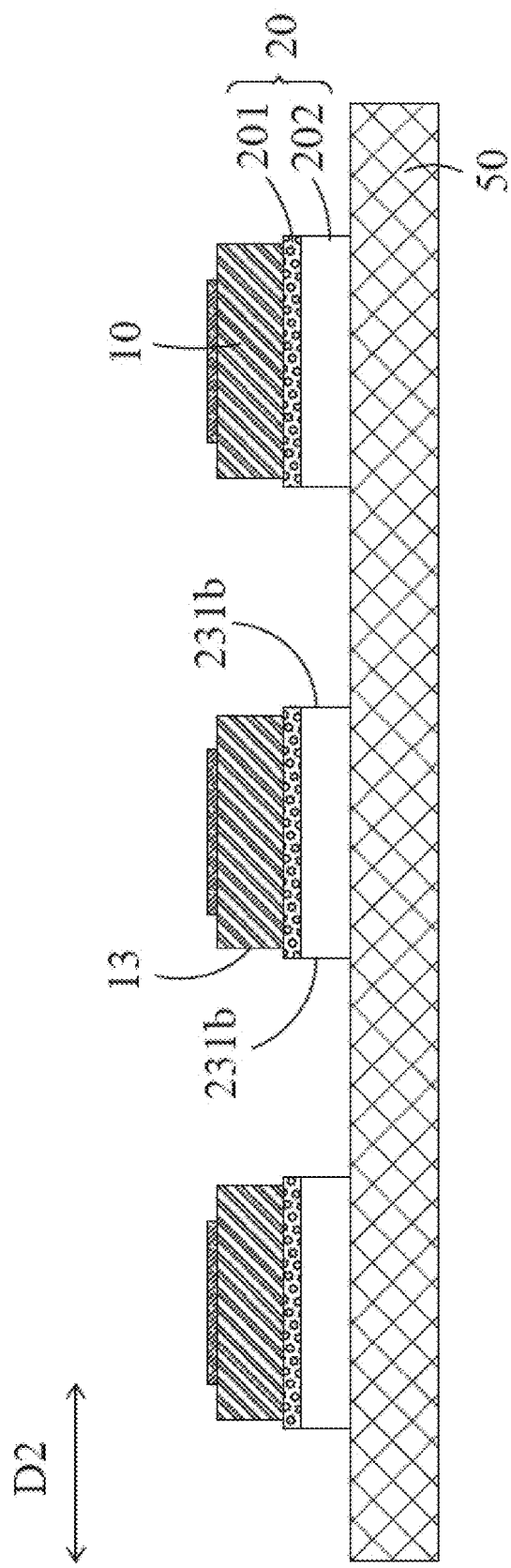

Next, as shown in FIG. 10A to FIG. 10C, the photoluminescent sheet is cut along the first horizontal direction D1 to selectively remove a portion of the supernatant light-transmitting layer 202 and the photoluminescent layer 201. It will be appreciated that the depth of the cut can be controlled so that the release layer 50 will not be cut through. After singulating and partially removing the supernatant light-transmitting layer 202 and the photoluminescent layer 201, as illustrated in FIG. 10C, a cross-sectional view with a cutting plane along the second horizontal direction D2 shows that resulting photoluminescent structures 20 are separated to have a gap between the lines comprising electro-luminescent structures. It is shown that the pair of side edges 231b is exposed. This fabrication process of selectively removing portions of the photoluminescent sheet is desired before forming a reflective structure. Additionally, as illustrated in FIG. 10B, a cross-sectional view along the first horizontal direction D1 shows that the photoluminescent structures 20 are connected with one another. It will be appreciated that in order to facilitate a subsequent singulation process and prevent a dicing saw from accidentally cutting and thus damaging the LED semiconductor die 10, a cutting margin is preserved from the edge surface 13 of the LED semiconductor die 10 by, for example, ranging from about 1 μm to about 100 μm, during the singulation process. Therefore, as illustrated in FIG. 10C, the width of the photoluminescent structure 20 is slightly larger than that of the LED semiconductor die 10.

Figure 11A:
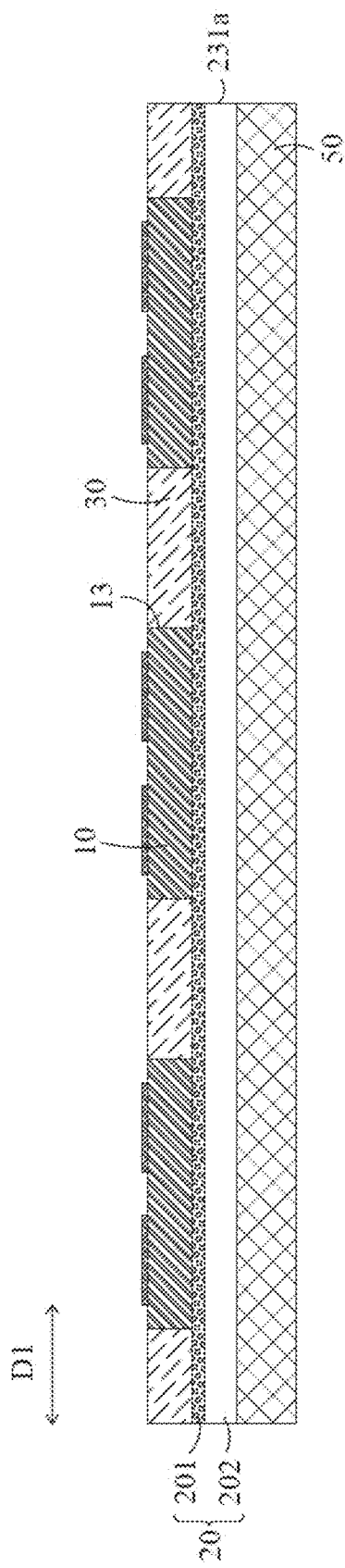
Figure 11B:
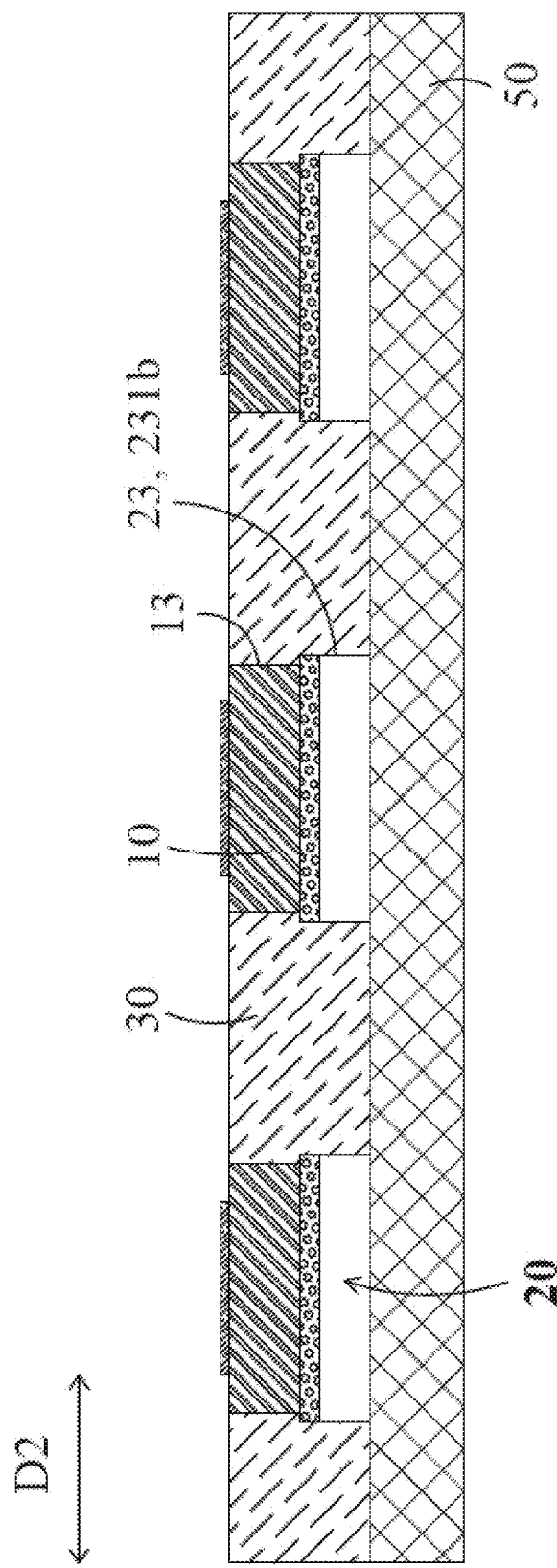

Next, as shown in FIG. 11A and FIG. 11B, the reflective structure 30 is disposed inside the grooves to cover the edge surface 13 of the LED semiconductor die 10 and the edge surface 23 of the photoluminescent structure 20. Since the side edges 231b perpendicular to the second horizontal direction D2 are exposed after singulating and partially removing the supernatant light-transmitting layer 202 and the photoluminescent layer 201, the reflective structure 30 can adjoin and cover the side edges 231b, as shown in FIG. 11B. On the other hand, the side edges 231a perpendicular to the first horizontal direction D1 are not exposed, so they are not covered by the reflective structure 30, as shown in FIG. 11A.

Figure 12A:
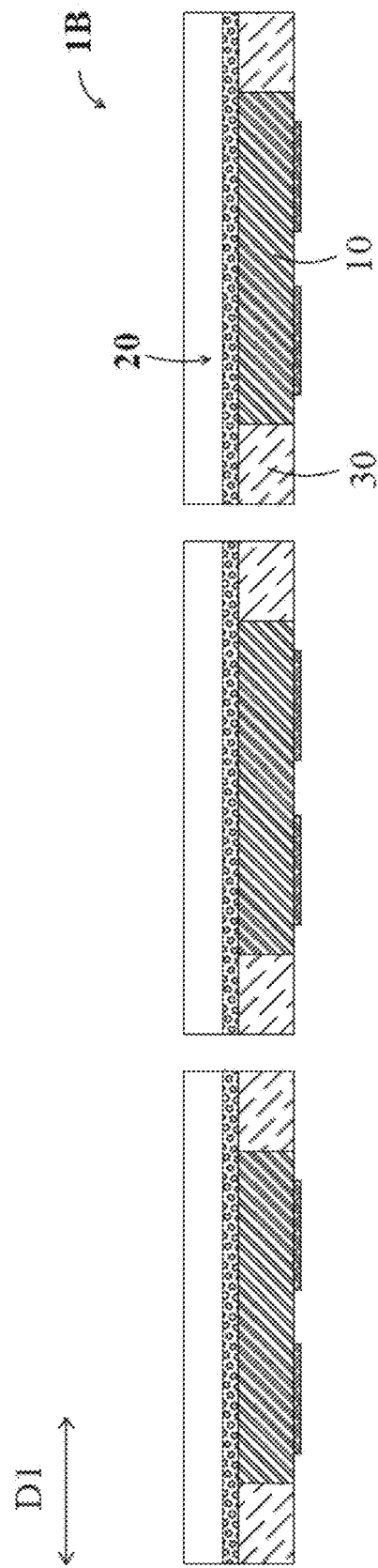
Figure 12B:
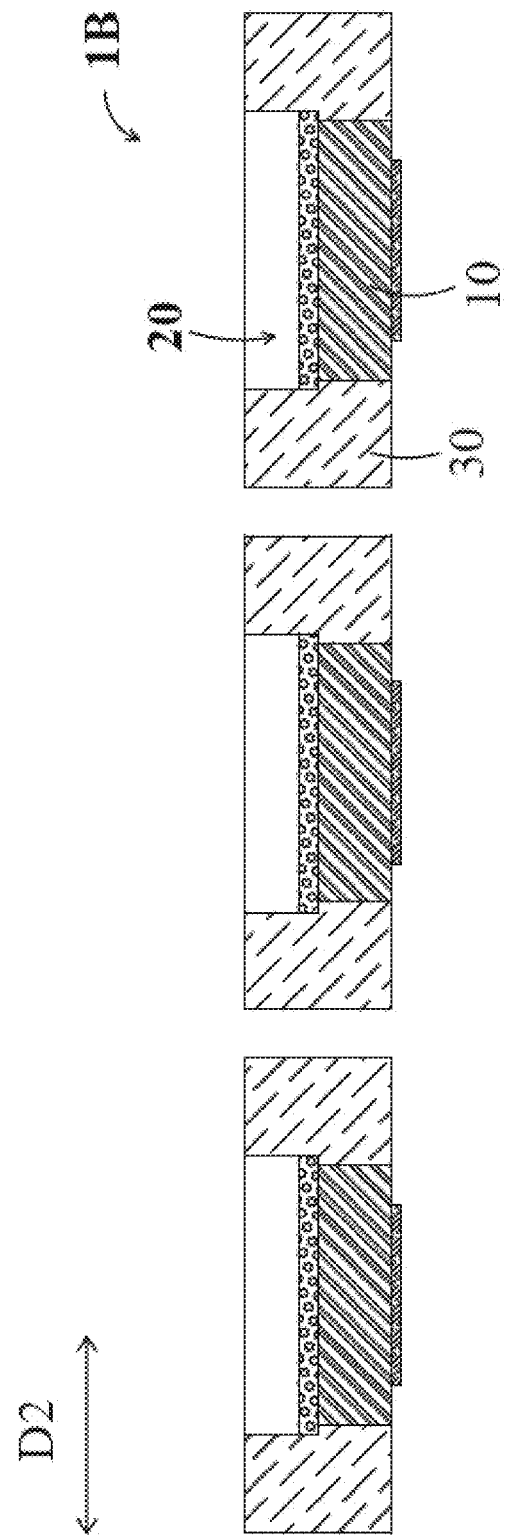

After the reflective structure 30 is formed, the release layer 50 is removed (not illustrated) to obtain a sheet structure comprising an array of CSP LED devices 1B, so that the photoluminescent structures 20 and the reflective structures 30 of the CSP LED devices 1B are still connected with one another. Next, another singulation process is performed to separate the connected photoluminescent structures 20 and the reflective structures 30. As shown in FIG. 12A and FIG. 12B, the CSP LED devices 1B are separated from each other after the singulation process. Specifically, the reflective structures 30 connecting with one another are cut along the first horizontal direction D1 without cutting the photoluminescent structures 20, while both the reflective structures 30 and the photoluminescent structures 20 connecting with one another are cut along the second horizontal direction D2.

The aforementioned paragraphs are detailed descriptions of the manufacturing method for the embodiment of the CSP LED device 1B according to the present disclosure. Detailed descriptions of another manufacturing method for the embodiment of the CSP LED device 1C according to the present disclosure are explained as follows.

FIG. 13 to FIG. 18B illustrate a sequence of fabrication stages of the manufacturing method to fabricate the embodiment of the CSP LED device 1C according to the present disclosure.

Figure 14:
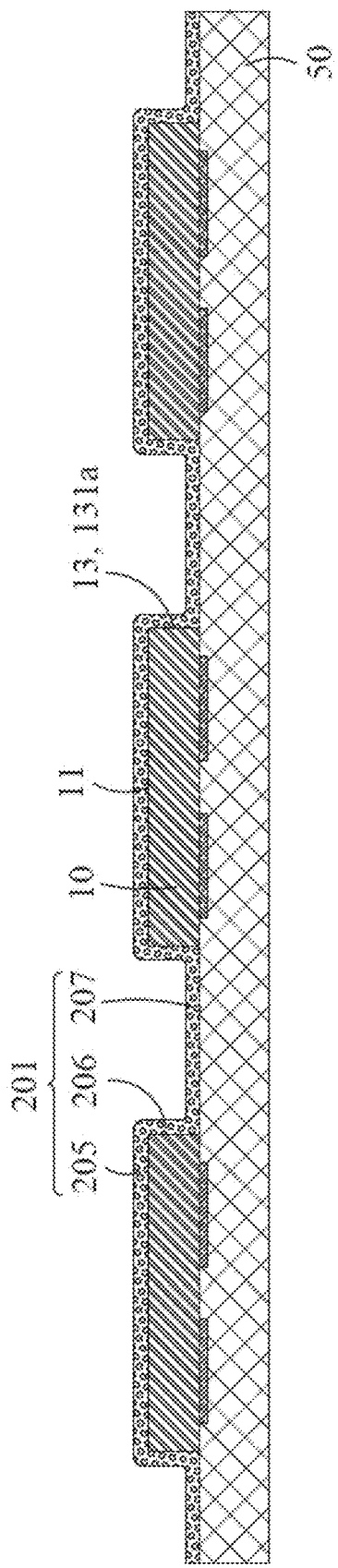

First, as shown in FIG. 13, a plurality of LED semiconductor dies 10 are arranged on a release layer 50 to form an array of LED semiconductor dies 10 with a fixed distance of pitch. Subsequently, as shown in FIG. 14, the photoluminescent layer 201 is formed covering the upper surface 11 and the edge surface 13 of the LED semiconductor 10, and covering the exposed area of the release layer 50. More specifically, after forming the photoluminescent layer 201, the upper surface 11 of the LED semiconductor die 10 is covered by the top portion 205 of the photoluminescent layer 201, the side edges 131a and 131b of the edge surface 13 are covered by the edge portion 206 of the photoluminescent layer 201, and the exposed area of the release layer 50 is covered by the extension portion 207 of the photoluminescent layer 201. Desirably, the photoluminescent layer 201 may be formed by the method disclosed in U.S. patent publication US2010/0119839.

Figure 15A:
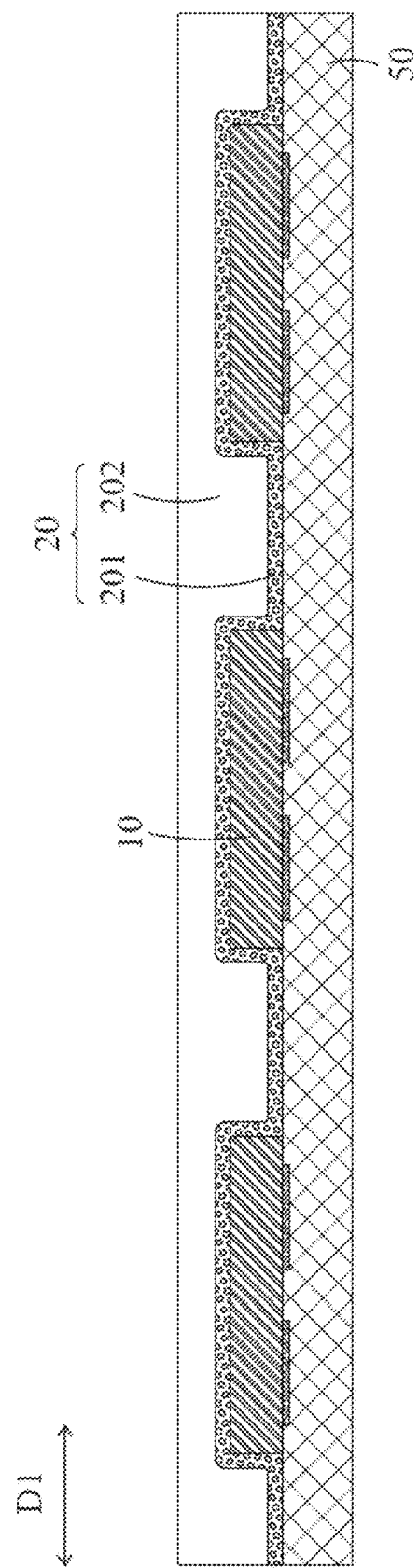
Figure 15B:
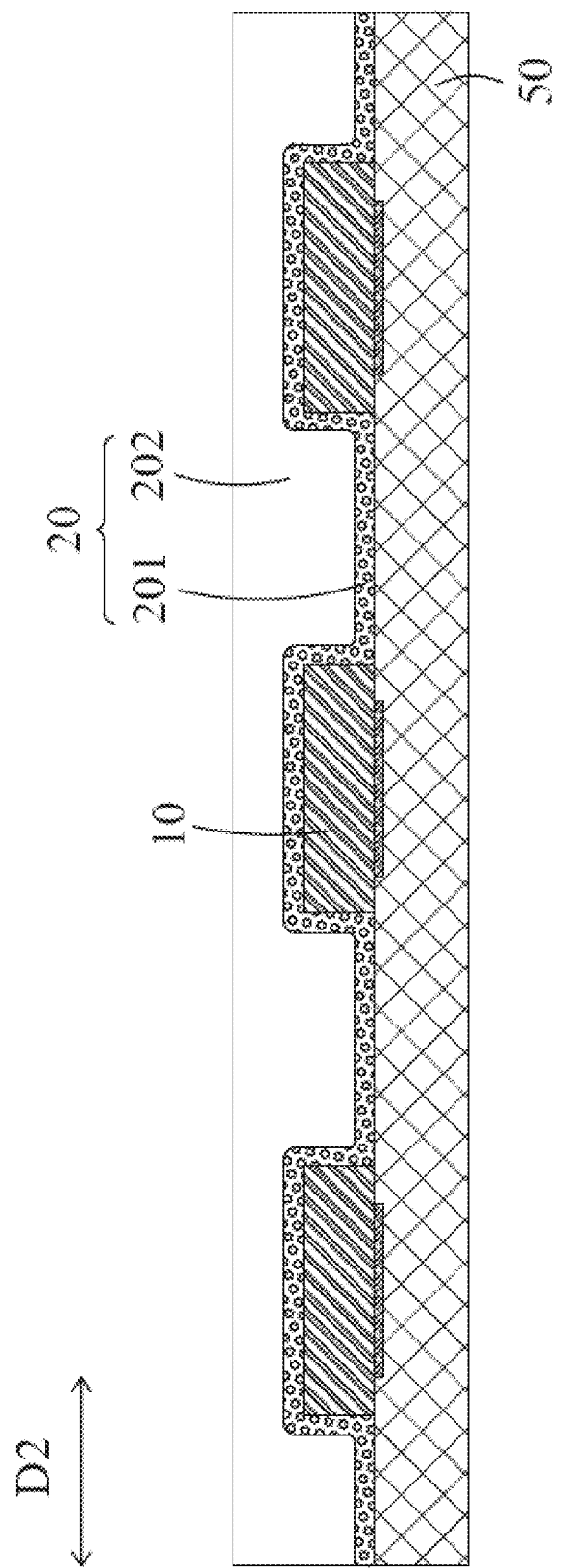

Next, as shown in FIG. 15A and FIG. 15B, a supernatant light-transmitting layer 202 is formed stacked on the photoluminescent layer 201. For this fabrication stage, a molding process could be used to form the supernatant light-transmitting layer 202, wherein a mold having a plurality of microstructure shapes on its inner mold surface is optionally included. The microstructure shapes on the inner mold surface can transfer to the outer surface of the microstructures of the micro-lens array layer as shown in FIG. 1F.

Thus, the supernatant light-transmitting layer 202' comprising a micro-lens array layer can be formed after molding.

Figure 16A:
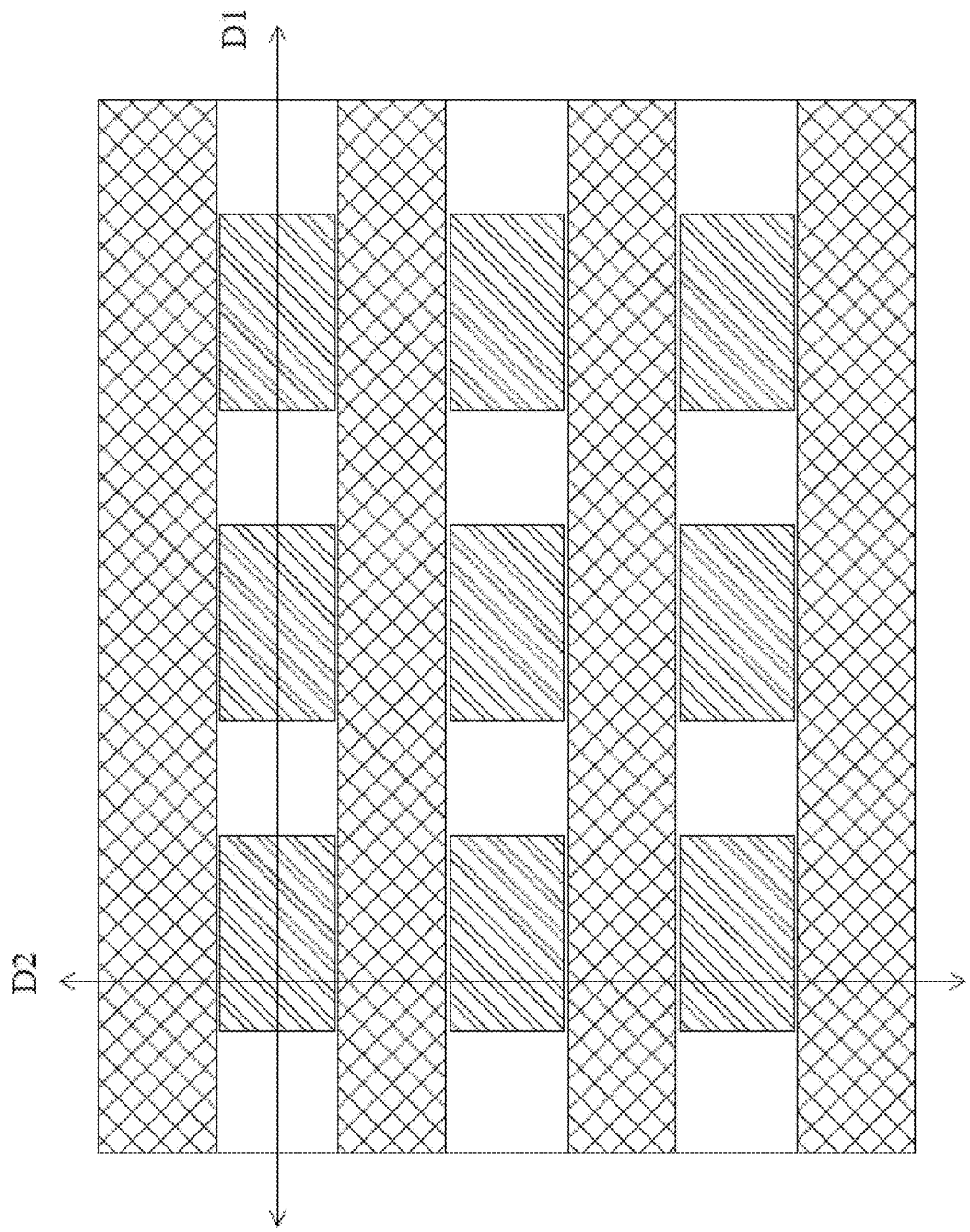
Figure 16B:
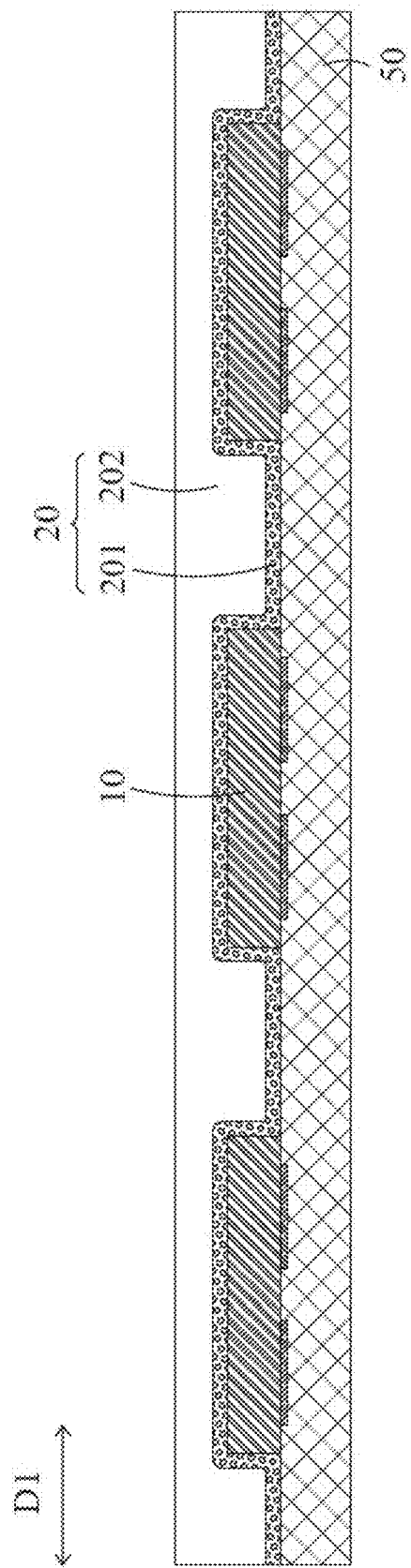
Figure 16C:
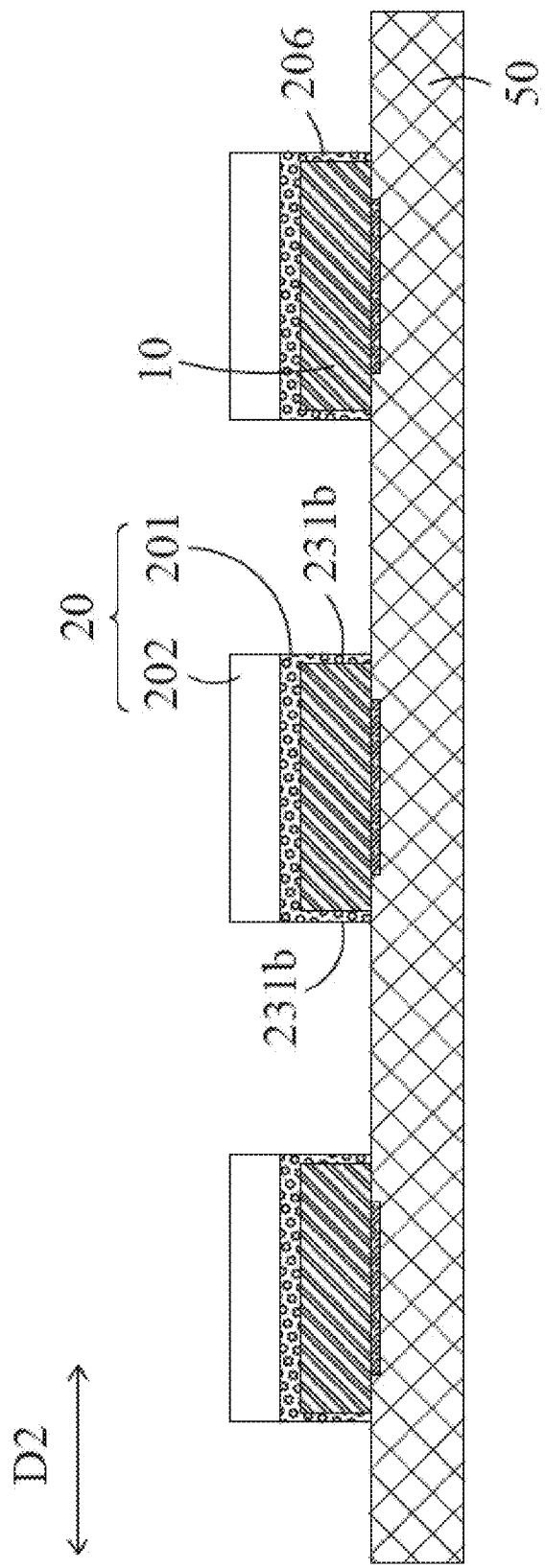

Next, as shown in FIG. 16A to FIG. 16C, the photoluminescent sheet is cut along the first horizontal direction D1 to selectively remove a portion of the supernatant light-transmitting layer 202 and the photoluminescent layer 201. After singulating and partially removing the supernatant light-transmitting layer 202 and the photoluminescent layer 201, a cross-sectional view with a cutting plane along the first horizontal direction D1, as shown in FIG. 16B, shows that resulting photoluminescent structures 20 are connected with one another, whereas a cross-sectional view with a cutting plane along the second horizontal direction D2, as shown in FIG. 16C, shows that the photoluminescent structures 20 are separated and the two side edges 231b are exposed.

Figure 17A:
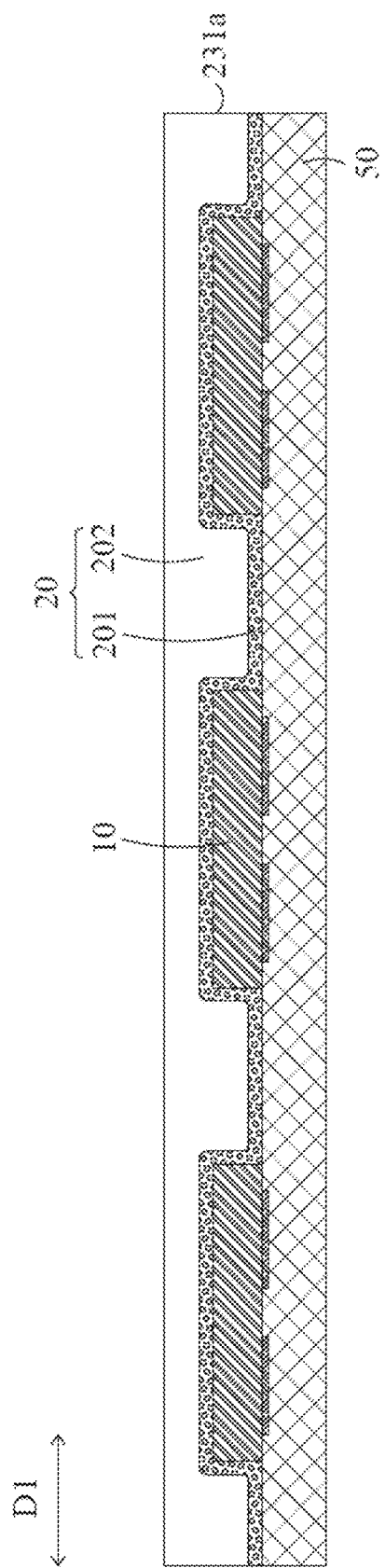
Figure 17B:
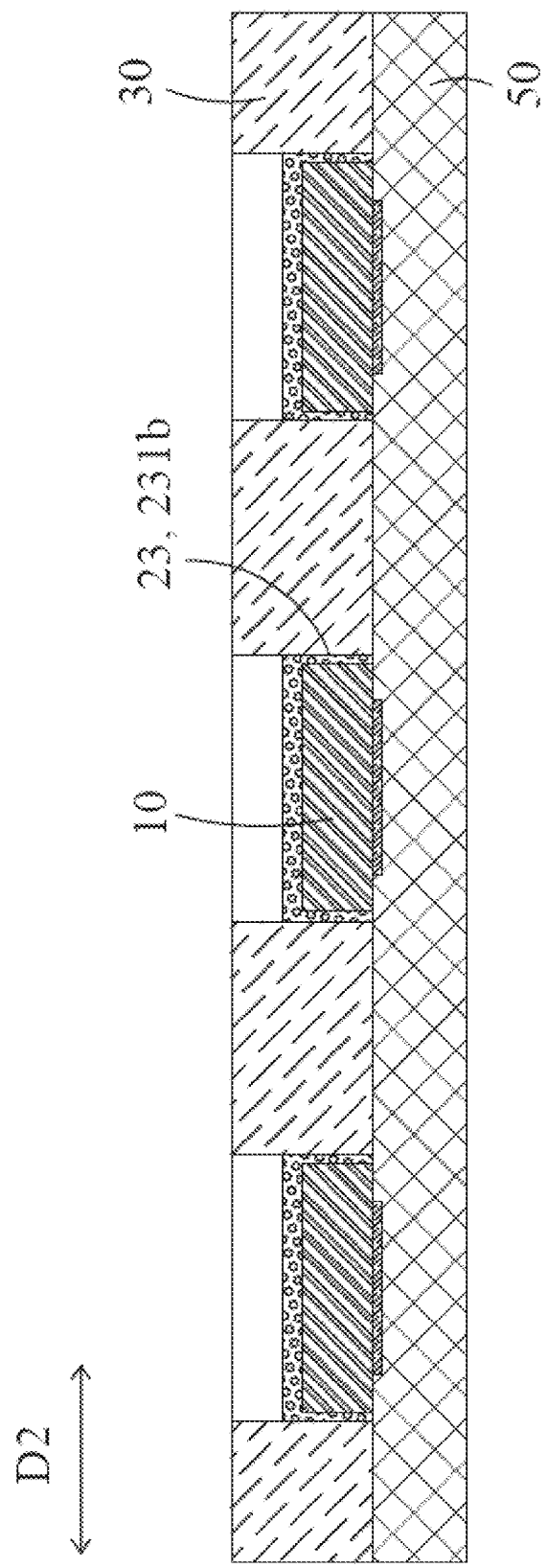

Next, as shown in FIG. 17A and FIG. 17B, a reflective structure 30 is disposed to cover the edge surface 23 of the photoluminescent structure 20. Since the side edges 231b perpendicular to the second horizontal direction D2 are exposed after selective removal of the supernatant light-transmitting layer 202 and the photoluminescent layer 201, the reflective structure 30 can adjoin and cover the side edges 231b, as shown in FIG. 17B. On the other hand, as shown in FIG. 17A, the side edges 231a perpendicular to the first horizontal direction D1 are not exposed, so they are not covered by the reflective structure 30.

Figure 18A:
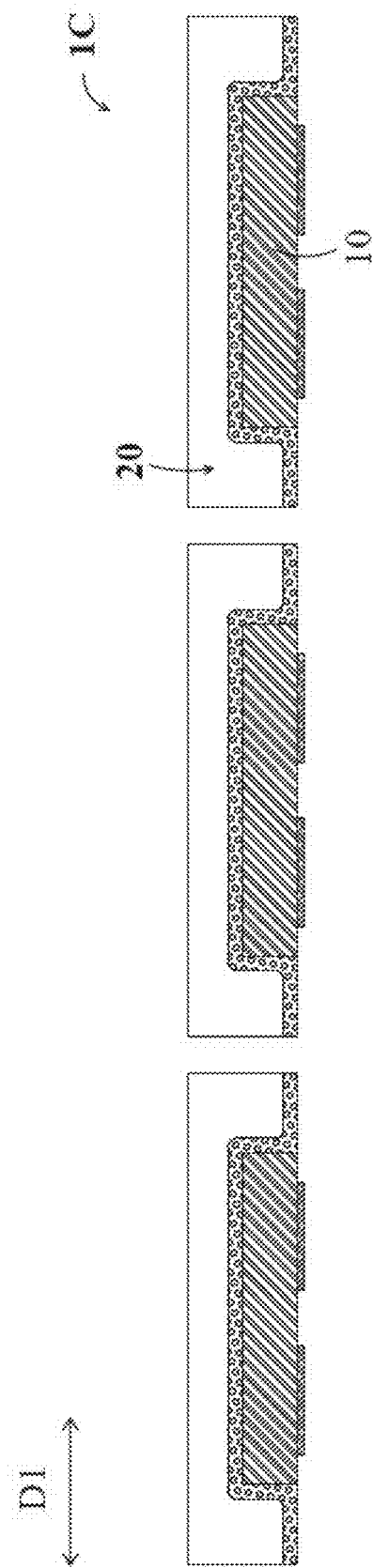
Figure 18B:
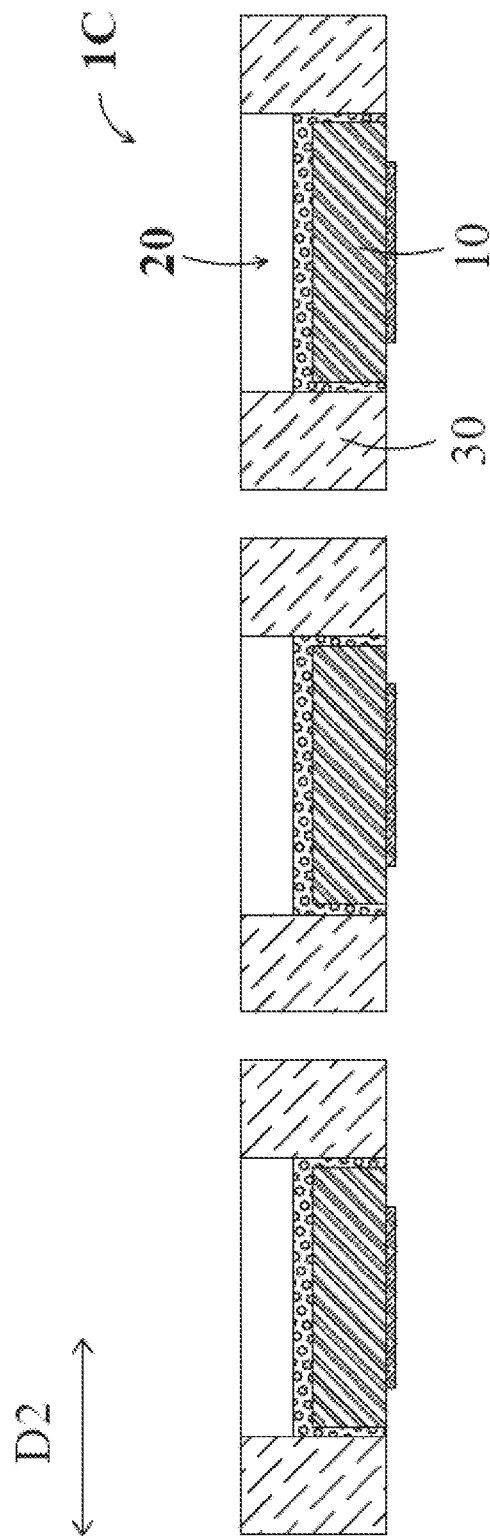

After the reflective structure 30 is formed, the release layer 50 is removed (not illustrated) to obtain a sheet layer comprising a plurality of CSP LED devices 1C, wherein the photoluminescent structures 20 and the reflective structures 30 of the CSP LED devices 1C are still connected with one another. Next, a singulation process is performed to separate the connected photoluminescent structures 20 and the reflective structures 30. After singulation, the CSP LED devices 1C are separated from each other, as shown in FIG. 18A and FIG. 18B. Specifically, the reflective structures 30 connecting with one another are singulated along the first horizontal direction D1 without singulating the photoluminescent structures 20, whereas both the reflective structures 30 and the photoluminescent structures 20 connecting with one another are singulated along the second horizontal direction D2.

Furthermore, a manufacturing sequence to fabricate a CSP LED device corresponding to the CSP LED device 1D shown in FIG. 4A to FIG. 4D is described as follows. In the embodiment of the manufacturing method illustrated by FIG. 13 to FIG. 18B according to the present disclosure, an array of LED semiconductor dies 10 as shown in FIG. 13 is arranged first. Next, light scattering particles are dispersed into a substantially transparent resin material to form a reflective resin material, which may be further diluted with an organic solvent, such as octane, xylene, acetate, ether, toluene, and so forth, to lower its entire viscosity. The diluted reflective resin material having a relatively low viscosity may be coated onto the surface of the array of LED semiconductor dies 10 and the open area of the release layer 50 using a fabrication process of spray coating or the like. Due to its low viscosity, most of the diluted reflective resin material will flow from a higher place (such as the upper surface 11 of the semiconductor die 10) to a lower place (such as the open area of the release layer 50) caused by gravity, and eventually being uniformly distributed on the open area of the release layer 50. After a thermal curing process, a reflective under-layer 40 as shown in FIG. 4A to FIG. 4D can be formed. Then, the CSP LED device 1D according to the present disclosure can be manufactured by following the fabrication stages shown from FIG. 14 to FIG. 18B.

Alternatively, the reflective under-layer 40 may also be formed by way of a dispensing process. Specifically, a relatively fewer volume of the reflective resin material is dispensed into the grooves among the array of LED semiconductor dies 10 pre-arranged on top of the release layer 50, and then the reflective resin material tends to be uniformly distributed covering the release layer 50 due to the gravity effect. After curing the reflective resin material, the reflective under-layer 40 is formed accordingly.

In view of the above, several embodiments of the manufacturing methods are disclosed to fabricate various CSP LED devices so that the viewing angle in at least one specific horizontal direction is restricted, thus providing an overall asymmetrical irradiation pattern. The disclosed methods are well suitable using batch mass production processes.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A light emitting device comprising:
   a flip-chip light emitting diode (LED) semiconductor die comprising an upper surface, a lower surface opposite to the upper surface, an edge surface, and a set of electrodes, wherein the edge surface of the flip-chip LED semiconductor die extends between the upper surface of the flip-chip LED semiconductor die and the lower surface of the flip-chip LED semiconductor die, and the set of electrodes is disposed on the lower surface of the flip-chip LED semiconductor die;
   a photoluminescent structure comprising an upper surface, a lower surface opposite to the upper surface of the photoluminescent structure, and an edge surface extending between the upper surface and the lower surface of the photoluminescent structure, wherein the lower surface of the photoluminescent structure covers at least the upper surface of the flip-chip LED semiconductor die, and the photoluminescent structure comprises a photoluminescent layer and a supernatant light-transmitting layer disposed on the photoluminescent layer; and
   a reflective structure at least partially covering the edge surface of the flip-chip LED semiconductor die and the edge surface of the photoluminescent structure;
   wherein a first horizontal direction and a second horizontal direction perpendicular to the first horizontal direction are specified along a length and a width of the light emitting device, respectively, wherein:
the edge surface of the flip-chip LED semiconductor die comprises two pairs of side edges covered by the reflective structure, wherein one pair of the side edges of the flip-chip LED semiconductor die is perpendicular to the first horizontal direction, another pair of the side edges of the flip-chip LED semiconductor die is perpendicular to the second horizontal direction,
a surface area of the lower surface of the photoluminescent structure is larger than a surface area of the upper surface of the flip-chip LED semiconductor die; and
the edge surface of the photoluminescent structure comprises two pairs of side edges, wherein one pair of the side edges of the photoluminescent structure perpendicular to the second horizontal direction is covered by the reflective structure, and another pair of the side edges of the photoluminescent structure perpendicular to the first horizontal direction is not covered by the reflective structure.

2. A light emitting device comprising:
a flip-chip light emitting diode (LED) semiconductor die comprising an upper surface, a lower surface opposite to the upper surface, an edge surface, and a set of electrodes, wherein the edge surface of the flip-chip LED semiconductor die extends between the upper surface of the flip-chip LED semiconductor die and the lower surface of the flip-chip LED semiconductor die, and the set of electrodes is disposed on the lower surface of the flip-chip LED semiconductor die;
a photoluminescent structure comprising an upper surface, a lower surface opposite to the upper surface of the photoluminescent structure, and an edge surface extending between the upper surface and the lower surface of the photoluminescent structure, wherein the lower surface of the photoluminescent structure covers at least the upper surface of the flip-chip LED semiconductor die, and the photoluminescent structure comprises a photoluminescent layer and a supernatant light-transmitting layer disposed on the photoluminescent layer; and
a reflective structure at least partially covering the edge surface of the flip-chip LED semiconductor die and the edge surface of the photoluminescent structure;
wherein a first horizontal direction and a second horizontal direction perpendicular to the first horizontal direction are specified along a length and a width of the light emitting device, respectively,
wherein:
two pairs of side edges of the edge surface of the flip-chip LED semiconductor die are covered by the photoluminescent structure, wherein one pair of the side edges of the flip-chip LED semiconductor die is perpendicular to the first horizontal direction, and another pair of the side edges of the flip-chip LED semiconductor die is perpendicular to the second horizontal direction; and
the edge surface of the photoluminescent structure comprises two pairs of side edges, wherein one pair of the side edges of the photoluminescent structure perpendicular to the second horizontal direction is covered by the reflective structure, another pair of the side edges of the photoluminescent structure perpendicular to the first horizontal direction is not covered by the reflective structure.

3. The light emitting device according to claim 2, further comprises a reflective under-layer disposed underneath the photoluminescent structure, wherein the reflective under-layer comprises at least a light-transmitting resin material and light scattering particles, the reflective under-layer is adjacent to the lower surface of the photoluminescent structure, and covers at least a portion of the edge surface of the flip-chip LED semiconductor die.

4. The light emitting device according to claim 2, wherein the photoluminescent layer of the photoluminescent structure comprises a top portion covering the upper surface of the flip-chip LED semiconductor die, an edge portion covering the edge surface of the flip-chip LED semiconductor die, and an extension portion extending outwardly from the edge portion of the photoluminescent layer.

5. The light emitting device according to claim 1 or claim 2, wherein the supernatant light-transmitting layer of the photoluminescent structure further comprises a micro-lens array layer.

6. The light emitting device according to claim 1 or claim 2, further comprising a submount substrate, and the flip-chip LED semiconductor die is electrically connected to the submount substrate.

7. The light emitting device according to claim 1 or claim 2, wherein the photoluminescent structure further comprises another light-transmitting layer disposed underneath the photoluminescent layer.

8. The light emitting device according to claim 1 or claim 2, wherein the reflective structure comprises at least a light-transmitting resin material and light scattering particles.

9. The light emitting device according to claim 8, wherein the light-transmitting resin material comprises at least one of polyphthalamide, polycyclohexylene-dimethylene terephthalate, epoxy molding compound, or silicone resin; and the light scattering particles comprise at least one of $TiO_2$, $BN$, $SiO_2$, or $Al_2O_3$.

10. A light emitting device comprising:
a flip-chip LED semiconductor die comprising an upper surface, a lower surface opposite to the upper surface, an edge surface, and a set of electrodes, wherein the edge surface extends between the upper surface of the flip-chip LED semiconductor die and the lower surface of the flip-chip LED semiconductor die, and the set of electrodes is disposed on the lower surface of the flip-chip LED semiconductor die;
a light-transmitting structure comprising an upper surface, a lower surface opposite to the upper surface of the light-transmitting structure, and an edge surface extending between the upper surface and the lower surface of the light-transmitting structure, wherein the light-transmitting structure comprises a substantially optically transparent organic or inorganic material with respect to a spectrum emitted from the flip-chip LED semiconductor die, and the lower surface of the light-transmitting structure covers at least the upper surface of the flip-chip LED semiconductor die; and
a reflective structure at least partially covering the edge surface of the flip-chip LED semiconductor die and at least partially covering the edge surface of the light-transmitting structure to generate an asymmetrical radiation pattern,
wherein the edge surface of the light-transmitting structure comprises two pairs of side edges, one pair of the side edges of the light-transmitting structure is covered by the reflective structure, and another pair of the side edges of the light-transmitting structure is not covered by the reflective structure, wherein:
- a first horizontal direction and a second horizontal direction perpendicular to the first horizontal direction are specified along a length and a width of the light emitting device, respectively, and
- the edge surface of the flip-chip LED semiconductor die comprises two pairs of side edges covered by the reflective structure, wherein one pair of the side edges of the flip-chip LED semiconductor die is perpendicular to the first horizontal direction, another pair of the side edges of the flip-chip LED semiconductor die is perpendicular to the second horizontal direction.

11. The light emitting device according to claim 10, wherein:
- a surface area of the lower surface of the light-transmitting structure is larger than a surface area of the upper surface of the flip-chip LED semiconductor die.

* * * * *